United States Patent
Iwaki et al.

(10) Patent No.: US 8,916,276 B2
(45) Date of Patent: *Dec. 23, 2014

(54) COMPOSITE MATERIAL, LIGHT EMITTING ELEMENT AND LIGHT EMITTING DEVICE

(71) Applicant: Semiconductor Energy Laboratory Co., Ltd., Atsugi-shi, Kanagawa-ken (JP)

(72) Inventors: Yuji Iwaki, Atsugi (JP); Satoshi Seo, Kawasaki (JP); Daisuke Kumaki, Tokamachi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/735,286

(22) Filed: Jan. 7, 2013

(65) Prior Publication Data
US 2013/0119365 A1    May 16, 2013

Related U.S. Application Data

(63) Continuation of application No. 10/577,471, filed as application No. PCT/JP2006/305317 on Mar. 13, 2006, now Pat. No. 8,420,227.

(30) Foreign Application Priority Data

Mar. 23, 2005 (JP) ................. 2005-085056

(51) Int. Cl.
H01L 51/54     (2006.01)
H01L 51/50     (2006.01)
H01L 51/00     (2006.01)
H01L 51/52     (2006.01)

(52) U.S. Cl.
CPC ........ *H01L 51/5004* (2013.01); *H01L 51/5068* (2013.01); *H01L 51/0051* (2013.01); *H01L 2251/303* (2013.01); *H01L 51/0032* (2013.01); *H01L 51/0052* (2013.01); *H01L 51/0058* (2013.01); *H01L 51/0072* (2013.01); *H01L 51/5088* (2013.01); *H01L 51/5278* (2013.01); Y10S 428/917 (2013.01)
USPC ........... 428/690; 428/917; 313/504; 313/506; 252/301.16; 257/40; 257/88; 257/90; 257/E51.048

(58) Field of Classification Search
None
See application file for complete search history.

(56) References Cited

U.S. PATENT DOCUMENTS

| | | | |
|---|---|---|---|
| 5,281,489 A | 1/1994 | Mori et al. | |
| 5,404,075 A | 4/1995 | Fujikawa et al. | |
| 5,487,953 A | 1/1996 | Shirota et al. | |
| 5,989,737 A | 11/1999 | Xie et al. | |
| 6,013,384 A | 1/2000 | Kido et al. | |
| 6,084,176 A | 7/2000 | Shiratsuchi et al. | |
| 6,172,459 B1 | 1/2001 | Hung et al. | |
| 6,380,687 B1 | 4/2002 | Yamazaki | |
| 6,423,429 B2 | 7/2002 | Kido et al. | |
| 6,483,236 B1 | 11/2002 | Hung | |
| 6,486,601 B1 | 11/2002 | Sakai et al. | |
| 6,489,638 B2 | 12/2002 | Seo et al. | |
| 6,518,700 B1 | 2/2003 | Friend et al. | |
| 6,552,496 B2 | 4/2003 | Yamazaki | |
| 6,573,650 B2 | 6/2003 | Aoki et al. | |
| 6,589,673 B1 | 7/2003 | Kido et al. | |

(Continued)

FOREIGN PATENT DOCUMENTS

| | | |
|---|---|---|
| EP | 0520779 A2 | 12/1992 |
| EP | 0 855 848 | 7/1998 |

(Continued)

OTHER PUBLICATIONS

Yang et al., *Polyaniline as a Transparent Electrode for Polymer Light-Emitting Diodes: Lower Operating Voltage and Higher Efficiency*, Appl. Phys. Lett., vol. 64, No. 10, Mar. 7, 1994, pp. 1245-1247.
International Search Report dated Aug. 15, 2006 for Application No. PCT/JP2006/305317.
Written Opinion dated Aug. 15, 2006 for Application No. PCT/JP2006/305317.

(Continued)

*Primary Examiner* — Michael H Wilson
(74) *Attorney, Agent, or Firm* — Eric J. Robinson; Robinson Intellectual Property Law Office, P.C.

(57) ABSTRACT

An object of the present invention is to provide a composite material formed of an organic compound and an inorganic compound, and has an excellent carrier transporting property, an excellent carrier injecting property to the organic compound, as well as excellent transparency. A composite material of the present invention for achieving the above object is a composite material of an organic compound represented in the general formula below, and an inorganic compound. For the inorganic compound, an oxide of a transition metal, preferably an oxide of a metal belonging to groups 4 to 8 of the periodic table, in particular vanadium oxide, tantalum oxide, molybdenum oxide, tungsten oxide, rhenium oxide, and ruthenium oxide, can be used.

(1)

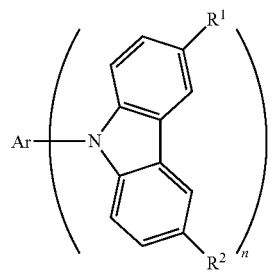

19 Claims, 18 Drawing Sheets

(56) References Cited

U.S. PATENT DOCUMENTS

| | | |
|---|---|---|
| 6,593,691 B2 | 7/2003 | Nishi et al. |
| 6,608,449 B2 | 8/2003 | Fukunaga |
| 6,642,544 B1 | 11/2003 | Hamada et al. |
| 6,650,047 B2 | 11/2003 | Aoki et al. |
| 6,690,033 B2 | 2/2004 | Yamazaki et al. |
| 6,774,573 B2 | 8/2004 | Yamazaki |
| 6,794,278 B2 | 9/2004 | Kido et al. |
| 6,830,494 B1 | 12/2004 | Yamazaki et al. |
| 6,831,408 B2 | 12/2004 | Hirano et al. |
| 6,872,472 B2 | 3/2005 | Liao et al. |
| 6,936,961 B2 | 8/2005 | Liao et al. |
| 7,074,500 B2 | 7/2006 | Pfeiffer et al. |
| 7,141,817 B2 | 11/2006 | Nishi et al. |
| 7,158,161 B2 | 1/2007 | Gyoutoku et al. |
| 7,256,422 B2 | 8/2007 | Yamazaki |
| 7,323,225 B2 | 1/2008 | Aoki et al. |
| 7,572,522 B2 | 8/2009 | Seo et al. |
| 7,649,197 B2 | 1/2010 | Iwaki et al. |
| 7,732,808 B2 | 6/2010 | Ikeda et al. |
| 8,420,227 B2 * | 4/2013 | Iwaki et al. .......... 428/690 |
| 2001/0004190 A1 | 6/2001 | Nishi et al. |
| 2001/0025959 A1 | 10/2001 | Yamazaki et al. |
| 2001/0041270 A1 | 11/2001 | Maruyama et al. |
| 2001/0043046 A1 | 11/2001 | Fukunaga |
| 2001/0046611 A1 | 11/2001 | Kido et al. |
| 2001/0053559 A1 | 12/2001 | Nagao et al. |
| 2002/0086180 A1 | 7/2002 | Seo et al. |
| 2002/0093290 A1 | 7/2002 | Yamazaki |
| 2003/0111666 A1 | 6/2003 | Nishi et al. |
| 2003/0151359 A1 | 8/2003 | Okada et al. |
| 2003/0160260 A1 | 8/2003 | Hirai et al. |
| 2003/0170491 A1 | 9/2003 | Liao et al. |
| 2003/0189401 A1 | 10/2003 | Kido et al. |
| 2003/0205696 A1 | 11/2003 | Thoms et al. |
| 2003/0214246 A1 | 11/2003 | Yamazaki |
| 2003/0218418 A9 | 11/2003 | Sato et al. |
| 2004/0140758 A1 | 7/2004 | Raychaudhuri et al. |
| 2004/0227460 A1 | 11/2004 | Liao et al. |
| 2005/0006667 A1 | 1/2005 | Yamazaki |
| 2005/0029933 A1 | 2/2005 | Liao et al. |
| 2005/0035708 A1 | 2/2005 | Yamazaki et al. |
| 2005/0084712 A1 | 4/2005 | Kido et al. |
| 2005/0084713 A1 | 4/2005 | Kido et al. |
| 2005/0098207 A1 | 5/2005 | Matsumoto et al. |
| 2005/0106419 A1 | 5/2005 | Endoh et al. |
| 2005/0170208 A1 | 8/2005 | Yatsunami et al. |
| 2005/0196526 A1 | 9/2005 | Ishida |
| 2005/0248267 A1 | 11/2005 | Gyoutoku et al. |
| 2006/0008740 A1 | 1/2006 | Kido et al. |
| 2007/0007516 A1 | 1/2007 | Seo et al. |
| 2007/0182317 A1 | 8/2007 | Kido et al. |
| 2007/0200125 A1 | 8/2007 | Ikeda et al. |
| 2008/0136325 A1 | 6/2008 | Yamazaki et al. |
| 2010/0084645 A1 | 4/2010 | Iwaki et al. |
| 2010/0096627 A1 | 4/2010 | Ikeda et al. |
| 2010/0207518 A1 | 8/2010 | Ikeda et al. |

FOREIGN PATENT DOCUMENTS

| | | |
|---|---|---|
| EP | 0 948 063 | 10/1999 |
| EP | 1 009 198 | 6/2000 |
| EP | 1 065 723 | 1/2001 |
| EP | 1 089 361 | 4/2001 |
| EP | 1 093 167 | 4/2001 |
| EP | 1 128 438 | 8/2001 |
| EP | 1 160 891 | 12/2001 |
| EP | 1 261 042 | 11/2002 |
| EP | 1 339 112 A | 8/2003 |
| EP | 1 351 558 | 10/2003 |
| EP | 1 478 025 | 11/2004 |
| EP | 1 524 706 | 4/2005 |
| EP | 1 524 707 | 4/2005 |
| EP | 1 530 245 | 5/2005 |
| EP | 1 617 493 | 1/2006 |
| JP | S61-202420 A | 9/1986 |
| JP | 01-312873 | 12/1989 |
| JP | 02-139892 | 5/1990 |
| JP | 03-114197 | 5/1991 |
| JP | 03-190088 | 8/1991 |
| JP | 03-274695 | 12/1991 |
| JP | 04-357694 | 12/1992 |
| JP | 05-182766 | 7/1993 |
| JP | 06-267658 | 9/1994 |
| JP | 06-290873 | 10/1994 |
| JP | 07-312289 | 11/1995 |
| JP | H08-288069 A | 11/1996 |
| JP | 09-063771 | 3/1997 |
| JP | H10-199681 A | 7/1998 |
| JP | 10-255985 | 9/1998 |
| JP | 10-270171 | 10/1998 |
| JP | 10-308284 | 11/1998 |
| JP | 2824411 | 11/1998 |
| JP | 11-251067 | 9/1999 |
| JP | 11-297474 | 10/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2001-076868 | 3/2001 |
| JP | 2001-185354 | 7/2001 |
| JP | 2001-244079 | 9/2001 |
| JP | 2002-015873 | 1/2002 |
| JP | 2002-332567 | 11/2002 |
| JP | 2002-367784 | 12/2002 |
| JP | 2003-229278 | 8/2003 |
| JP | 2003-272860 | 9/2003 |
| JP | 2004-134395 | 4/2004 |
| JP | 2004-514257 | 5/2004 |
| JP | 2004-342514 A | 12/2004 |
| JP | 2004-342614 | 12/2004 |
| JP | 2004-349007 | 12/2004 |
| JP | 2005-026121 | 1/2005 |
| JP | 2005-032618 | 2/2005 |
| JP | 2005-123094 | 5/2005 |
| JP | 2005-123095 | 5/2005 |
| JP | 2005-166637 | 6/2005 |
| JP | 2005-251529 | 9/2005 |
| JP | 2005-251587 | 9/2005 |
| JP | 2006-024791 | 1/2006 |
| WO | WO 00/01203 | 1/2000 |
| WO | WO 02/41414 | 5/2002 |
| WO | WO 2005/006460 | 1/2005 |
| WO | WO 2005/031798 A2 | 4/2005 |
| WO | WO 2005/048222 A1 | 5/2005 |
| WO | WO 2006/093171 | 9/2006 |

OTHER PUBLICATIONS

Nakada et al., "27a-ZL-12 Multi Photon Emission Organic EL Devices Using Charge-Transfer Complex as Charge Generation Layer," 63rd Applied Physics-Related Combined Seminar Seminar Proceedings, Sep. 24, 2002, p. 1165.

Tokito et al., "Metal Oxides as a Hole-Injecting Layer for an Organic Electroluminescent Device," J. Phys. D: Appl. Phys. (Journal of Physics D: Applied Physics), 1996, vol. 29, pp. 2750-2753.

Kido et al., "27.1: Invited Paper: High Efficiency Organic EL Devices having Charge Generation Layers," SID Digest '03: SID International Symposium Digest of Technical Papers, 2003, vol. 36, pp. 964-965.

European Search Report (Application No. 06729307.6) dated Oct. 27, 2010.

Kim H. et al., "Fabrication and Characterization of Metal Oxide Nanoparticles/Hole Transporting Polymer Composites", *49th Symposium on Macromolecules: Polymer Preprints Japan*, 2000, vol. 49, No. 10, pp. 3199-3200.

* cited by examiner

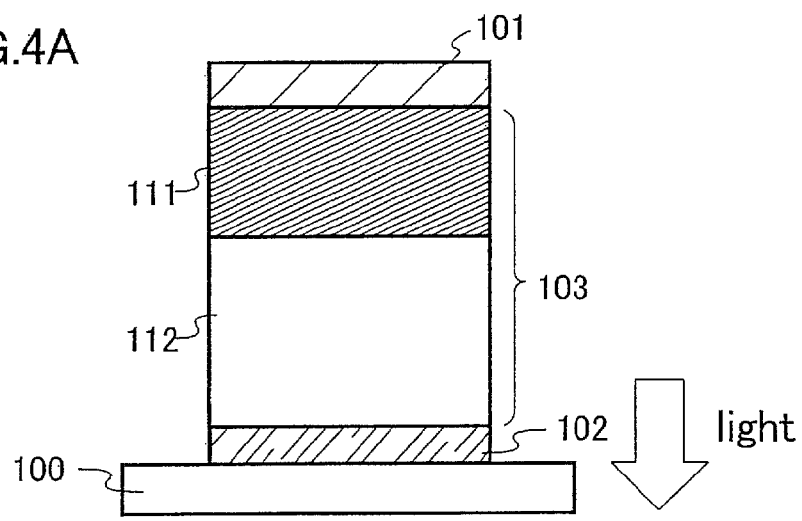
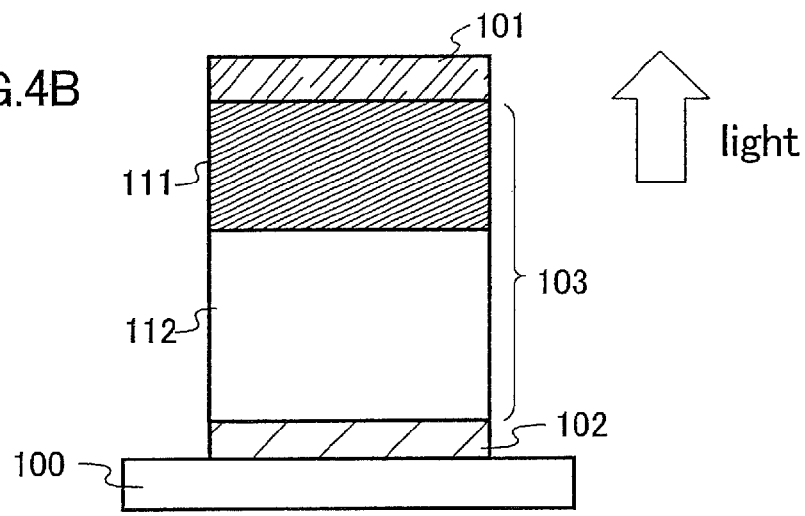
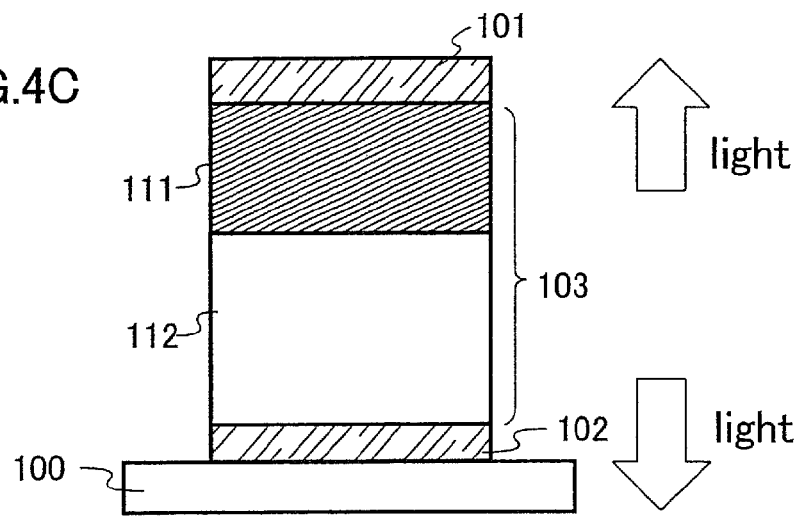

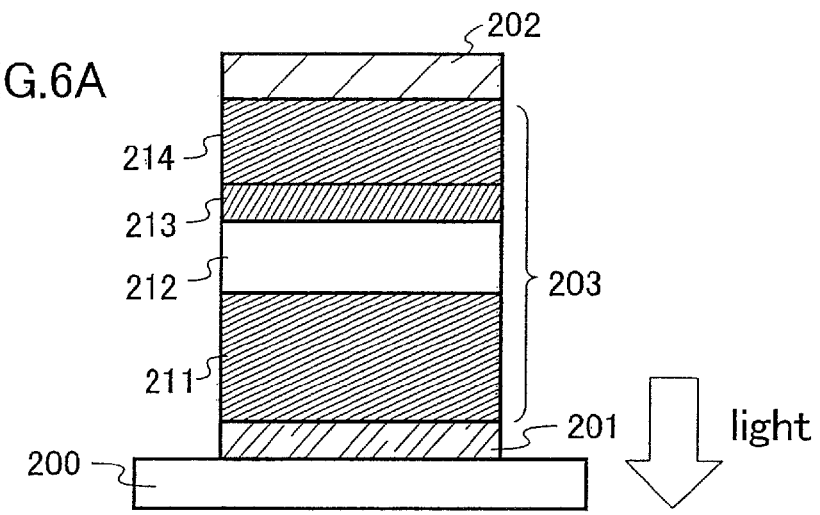
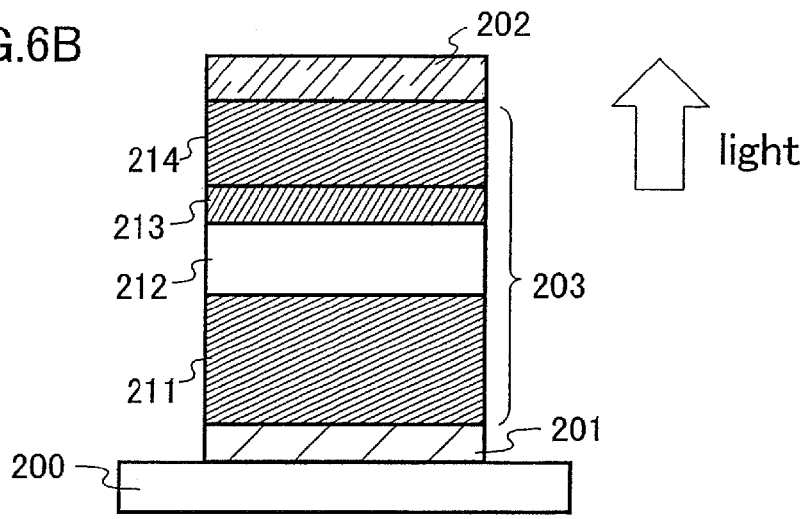
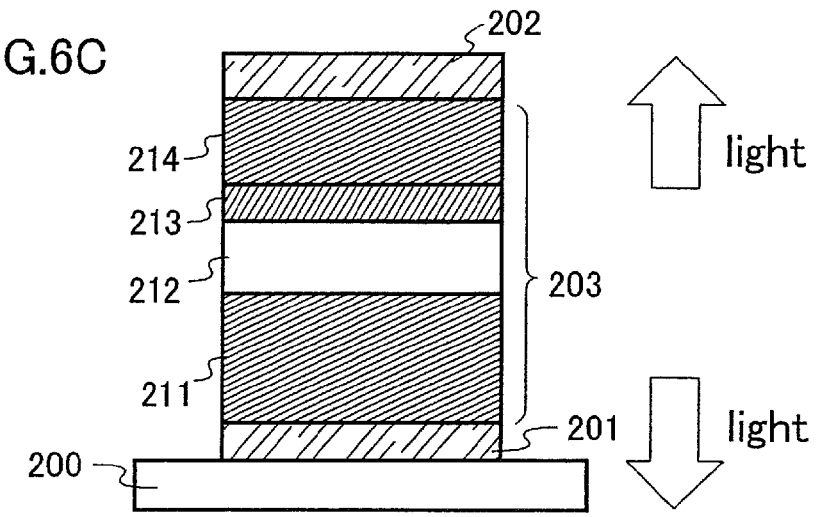

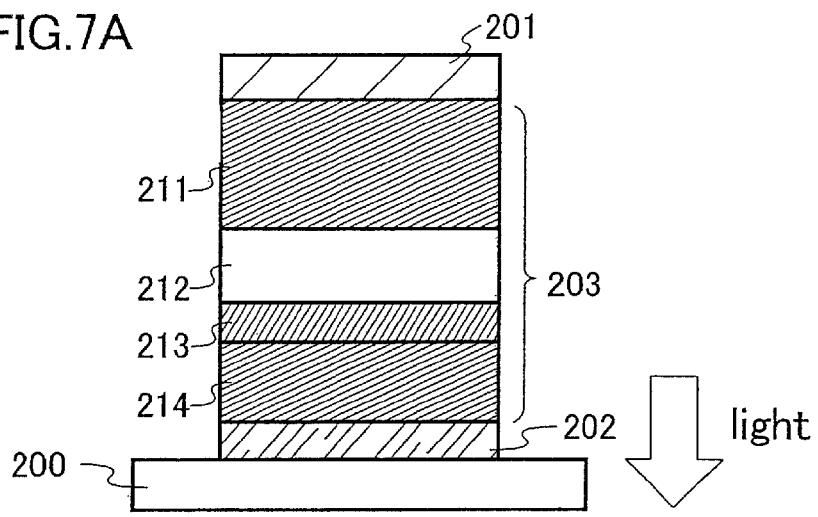
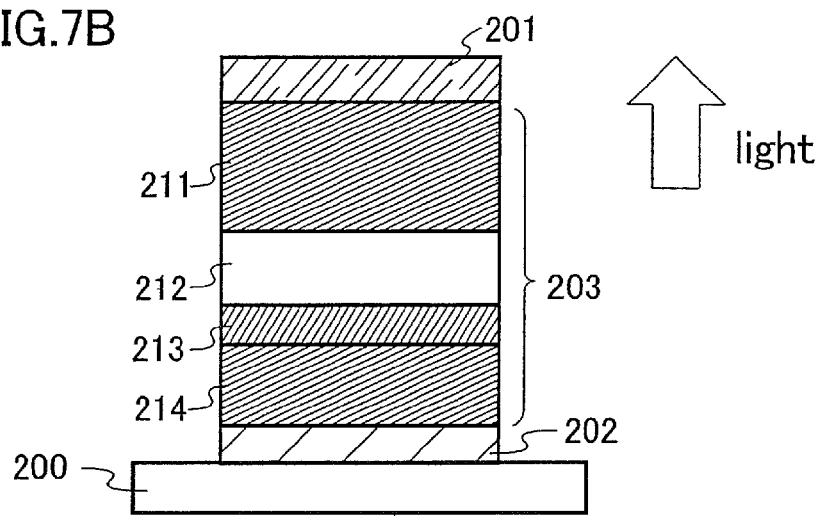
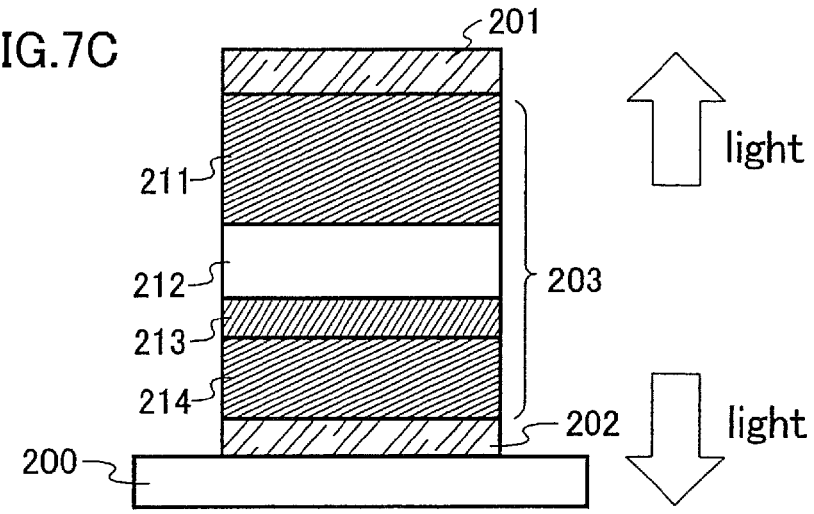

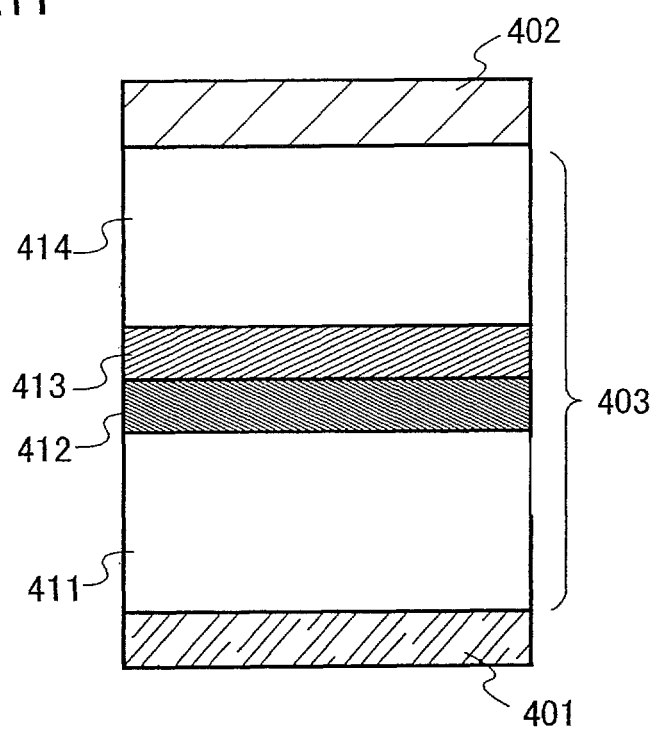

COMPOSITE MATERIAL, LIGHT EMITTING ELEMENT AND LIGHT EMITTING DEVICE

TECHNICAL FIELD

The present invention relates to a composite material having an organic compound and an inorganic compound. Also, the present invention relates to a current excitation light emitting element using the composite material.

BACKGROUND ART

In recent years, research and development for light emitting elements using organic compounds having light emitting properties, have been actively pursued. A basic structure for these light emitting elements is that of interposing a layer including an organic compound having a light emitting property between a pair of electrodes. By applying voltage to such an element, electrons and holes are injected from the pair of electrodes into the layer including an organic compound having a light emitting property, and current flows. Then, by those carriers (electrons and holes) recombining, the organic compound having a light emitting property forms an excited state, and light is emitted when the excited state returns to a ground state. Due to such mechanism, such a light emitting element is called a current excitation light emitting element.

Note that as types of excitation states which an organic compound forms, a singlet excited state and a triplet excited state are possible. Light emission from a singlet excited state is called fluorescence, and light emission from a triplet excited state is called phosphorescence.

Since such a light emitting element is usually formed as an approximately submicron-thin film, there is a great advantage that it can be manufactured to be thin and light weight. Furthermore, since the time it takes from carrier injection to light emission is about microseconds or less, another feature is that the response speed is extremely fast. It is thought that as an element for use in flat panel displays, these features are suitable.

Also, since these light emitting elements are formed in film forms, planar light emission can be easily obtained by forming a large-area element. Since this is a trait that is difficult to obtain by a point light source typified by incandescent lamps and LEDs, or by a line light source typified by fluorescent lights, utility value as a surface light source that can be applied to illumination is also high.

In this manner, there are hopes for the current excitation light emitting element using an organic compound material having a light emitting property to be applied to light emitting devices and illuminations; however, many challenges still remain. Reduction in power consumption is one of those challenges. In order to reduce power consumption, it is important to reduce the driving voltage of the light emitting element. Further, since the emission intensity of the current excitation light emitting element is determined by the amount of electrical current flowing, in order to reduce the driving voltage, it is necessary to feed many currents at low voltage.

Previously, as a method for reducing driving voltage, an approach of providing a buffer layer between an electrode and the layer including an organic compound having a light emitting property, has been attempted. For example, it is known that driving voltage can be reduced by providing a buffer layer that is formed of polyaniline (PAni) doped with camphorsulfonic acid, between indium tin oxide (ITO: indium tin oxide) and a light emitting layer (for example, refer to Non-Patent Document 1: Y. Yang, et al. Applied Physics Letters, Vol. 64 (10), 1245-1247 (1994)). It is explained that this is because of the excellent carrier injecting property of PAni to the light emitting layer. Note that in the Non-Patent Document 1, PAni that is the buffer layer is also considered to be a part of an electrode.

However, as described in the Non-Patent Document 1, PAni has a problem that transmittance becomes poor when a film thickness becomes thick. Specifically, it is reported that at a film thickness of about 250 nm, the transmittance is less than 70%. In other words, since the problem is with the transparency of the material itself that is used for the buffer layer, light that is generated within an element cannot be taken out efficiently.

Also, according to a Patent Document 1: Japanese Patent Laid-Open No. 2003-272860, an approach of serially connecting light emitting elements (called a light emitting unit in the Patent Document 1) to improve the luminance per a certain current density, in other words, current efficiency, as been attempted. As for the Patent Document 1, for a connecting portion of when light emitting elements are serially connected, a mixed layer of an organic compound and a metal oxide (specifically, vanadium oxide and rhenium oxide) is applied, and it is considered that this layer can inject holes and electrons to a light emitting unit.

However, as apparent by looking at an embodiment, for the mixed layer of an organic compound and a metal oxide that is disclosed in the Patent Document 1, a high absorption peak is observed not only in the infrared region but also in the visible light region (around 500 nm), a problem in transparency occurs also. Therefore, as expected, light that is generated within an element cannot be taken out efficiently, and the light emission efficiency of the element is degraded.

DISCLOSURE OF INVENTION

In view of the above description, an object of the present invention is to provide a composite material that has an organic compound and an inorganic compound, with an excellent carrier transporting property, an excellent carrier injecting property to the organic compound, as well as excellent transparency.

Also, an object of the present invention is to provide a light emitting element that is excellent in both driving voltage and light emission efficiency, by applying the composite material to a current excitation light emitting element. Further, an object is to provide a light emitting device which has low power consumption, by manufacturing a light emitting device using the light emitting element.

The composite material of the present invention is a composite material of an organic compound having a particular skeleton and an inorganic compound, and the organic compound having a particular skeleton is an aryl carbazole which does not have an arylamine skeleton. An oxide of a transition metal can be used for the inorganic compound, and preferably, an oxide of a metal belonging to groups 4 to 8 of the periodic table is desirable. In particular, vanadium oxide, tantalum oxide, molybdenum oxide, tungsten oxide, rhenium oxide, and ruthenium oxide can be used suitably.

A layer formed of the above mentioned composite material is included in a portion of a light emitting element of the present invention. It is particularly desirable to form this layer between an electrode that functions as an anode and a light emitting layer. Also, at that time, providing the layer formed of the composite material of the present invention to be in contact with the electrode that functions as the anode is even better. Furthermore, in this case, the thickness of the layer formed of the composite material of the present invention may be 60 nm or more.

A light emitting device of the present invention is a light emitting device that is equipped with the above mentioned light emitting element.

By implementing the present invention, a composite material of an organic compound and an inorganic compound, and has an excellent carrier transporting property, an excellent carrier injecting property to the organic compound, as well as excellent transparency, can be provided.

Also, by applying the composite material to a current excitation light emitting element, a light emitting element that is excellent in both driving voltage and light emission efficiency can be provided. Furthermore, by manufacturing a light emitting device using the light emitting element, a light emitting device which has low power consumption can be provided.

Further, the layer formed of the composite material does not rise in driving voltage even if film thickness increases; therefore, optical design can be easily carried out, and reliability of a light emitting element can be improved.

BRIEF DESCRIPTION OF DRAWINGS

In the accompanying drawings:

FIGS. 4A to 4C describe a light emitting element of the present invention;

FIGS. 6A to 6C describe a light emitting element of the present invention;

FIGS. 7A to 7C describe a light emitting element of the present invention;

FIG. 11 describes a light emitting element of the present invention;

BEST MODE FOR CARRYING OUT THE INVENTION

Figure 1:
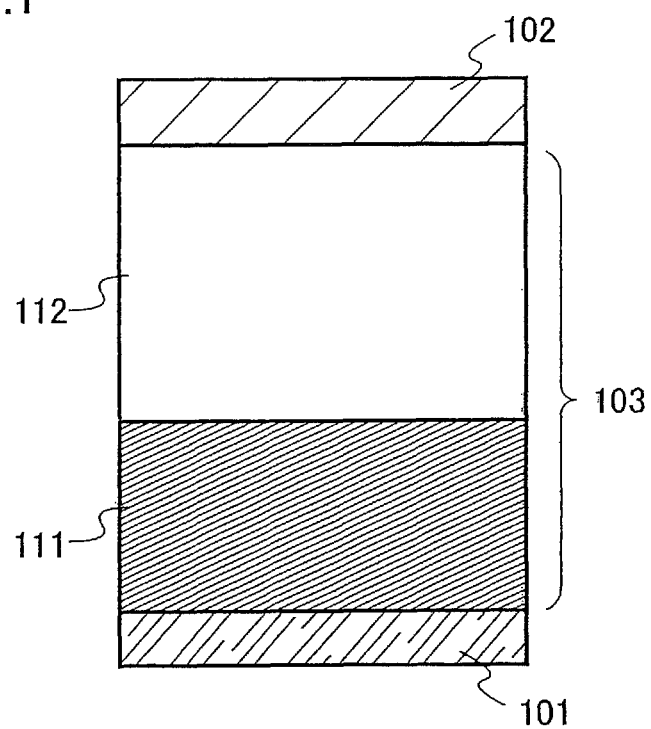
FIG. 1 describes a light emitting element of the present invention.

Embodiment Modes according to the present invention will hereinafter be described with reference to the accompanying drawings. However, the present invention can be implemented in a variety of modes, and it is easily understood by those skilled in the art that modes and details herein disclosed can be modified in various ways without departing from the spirit and the scope of the present invention. Therefore, the present invention should not be interpreted as being limited to the description of the embodiment modes to be given below.

Embodiment Mode 1

A structure of the composite material of the present invention will be described. The composite material of the present invention is a composite material of an organic compound having a particular skeleton and an inorganic compound. There is no limitation for a manufacturing method of the composite material of the present invention; however, it can be formed by a co-evaporation method where the organic compound and the inorganic compound are deposited simultaneously. The mixing ratio, in molar ratio, of the organic compound and the inorganic compound of the present invention is preferably around 1:0.1 to 1:10, and more desirably, 1:0.5 to 1:2. When forming the composite material by a co-evaporation method, the mixing ratio can be controlled by adjusting the deposition rate for each of the organic compound and the inorganic compound.

Organic compounds that can be used for the composite material of the present invention are the organic compound which are represented by the general formulas (1) to (4) below.

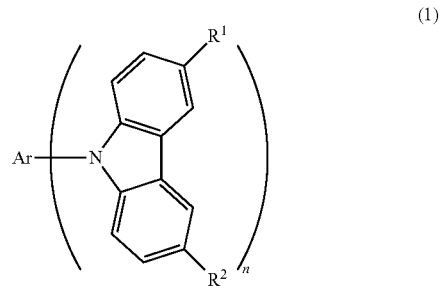

(1)

In this formula, Ar represents an aromatic series hydrocarbon group having 6 to 42 carbon atoms; n represents a natural number from 1 to 3; and $R^1$ and $R^2$ represent hydrogen, an alkyl group having 1 to 4 carbon atoms, or an aryl group having 6 to 12 carbon atoms.

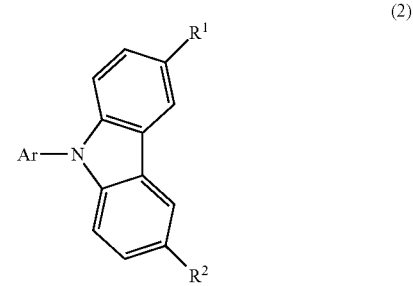

(2)

It is to be noted that in this formula, Ar represents a monovalent aromatic series hydrocarbon group having 6 to 42 carbon atoms; and $R^1$ and $R^2$ represent hydrogen, an alkyl group having 1 to 4 carbon atoms, or an aryl group having 6 to 12 carbon atoms.

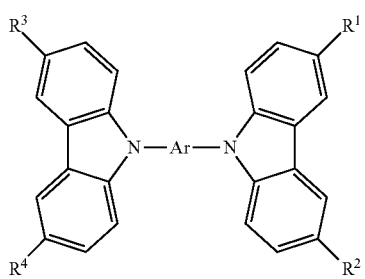
(3)

It is to be noted that in this formula, Ar represents a divalent aromatic series hydrocarbon group having 6 to 42 carbon atoms; and $R^1$ to $R^4$ represent hydrogen, an alkyl group having 1 to 4 carbon atoms, or an aryl group having 6 to 12 carbon atoms.

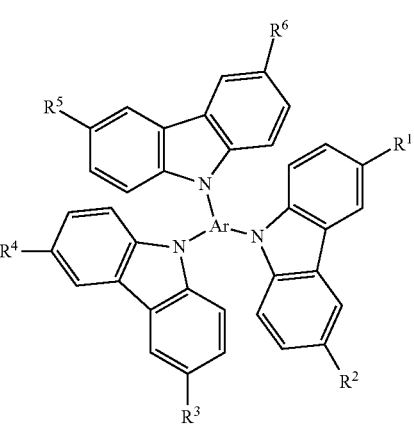
(4)

It is to be noted that in this formula, Ar represents a trivalent aromatic series hydrocarbon group having 6 to 42 carbon atoms; and $R^1$ to $R^6$ represent hydrogen, an alkyl group having 1 to 4 carbon atoms, or an aryl group having 6 to 12 carbon atoms.

Also, as organic compounds that can be used for the composite material of the present invention, the organic compounds represented by the general formulas (2) to (4) below are more preferable.

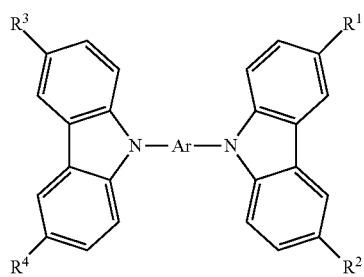
(2)

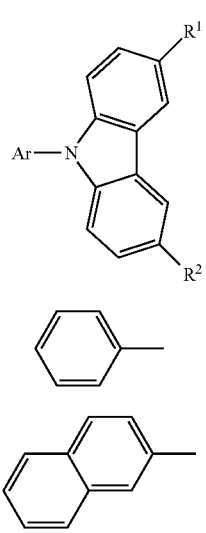
(2-1)
(2-2)

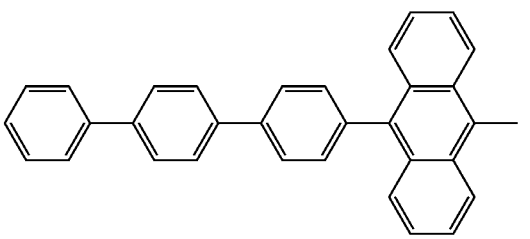
(2-3)

It is to be noted that in this formula, Ar represents one of the aromatic series hydrocarbon groups represented in the structural formulas (2-1) to (2-3); and $R^1$ and $R^2$ represent hydrogen, an alkyl group having 1 to 4 carbon atoms, or an aryl group having 6 to 12 carbon atoms.

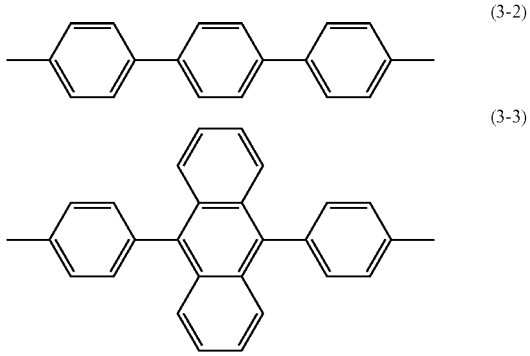
(3)

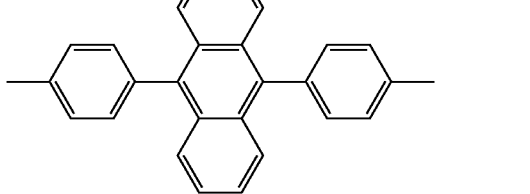
(3-1)
(3-2)
(3-3)

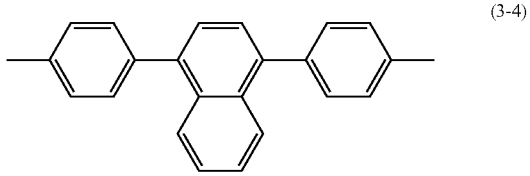
(3-4)

(3-5)

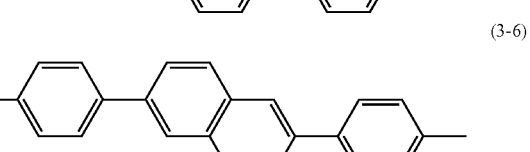
(3-6)

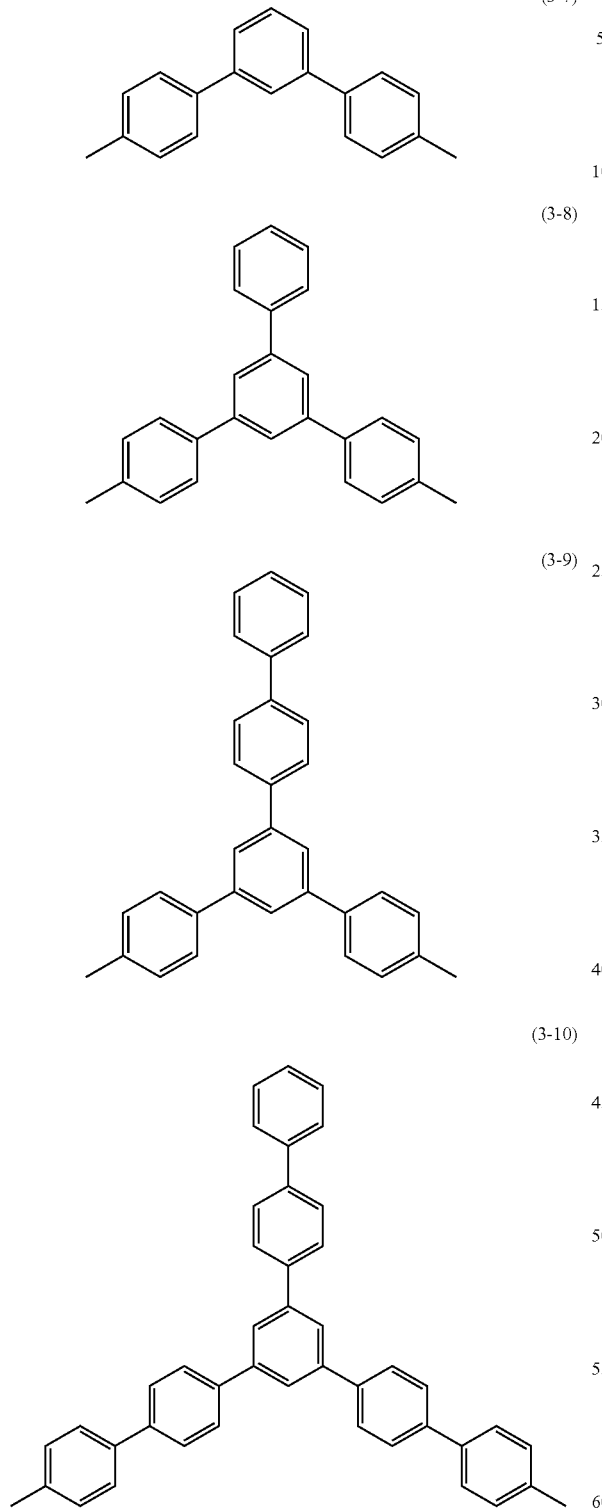
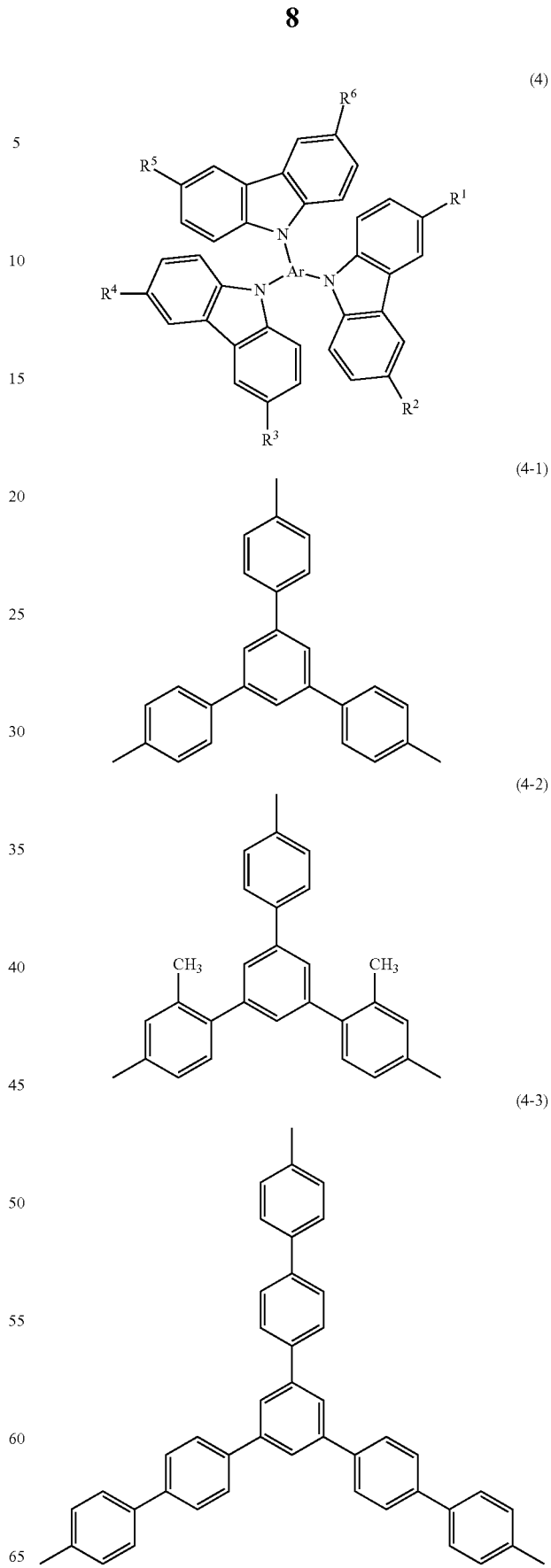
It is to be noted that in this formula, Ar represents one of the aromatic series hydrocarbon groups represented in the structural formulas (3-1) to (3-10); and $R^1$ to $R^4$ represent hydrogen, an alkyl group having 1 to 4 carbon atoms, or an aryl group having 6 to 12 carbon atoms.

It is to be noted that in this formula, Ar represents one of the aromatic series hydrocarbon groups represented in the structural formulas (4-1) to (4-3); and $R^1$ to $R^6$ represent hydrogen, an alkyl group having 1 to 4 carbon atoms, or an aryl group having 6 to 12 carbon atoms.

Note that in the above general formulas, as the alkyl group, a methyl group, an ethyl group, an isopropyl group, and a t-butyl group are preferable; and as the aryl group, a phenyl group, a tolyl group, a 2-biphenylyl group, and a 4-biphenylyl group are preferable.

Note that among the organic compounds represented in the above general formulas, using an organic compound having a hole mobility of $1 \times 10^{-6}$ cm$^2$/Vs in particular is preferable.

A part of the organic compounds represented by the above general formulas are shown as specific examples in the structural formulas (5) to (23).

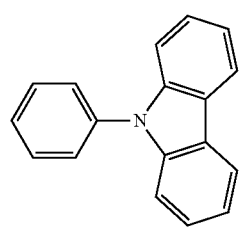

(5)

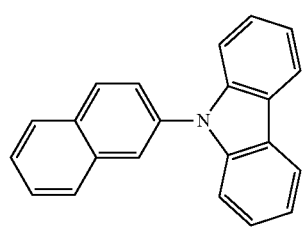

(6)

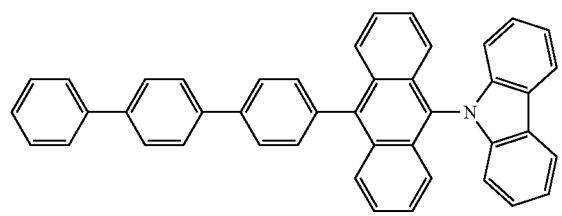

(7)

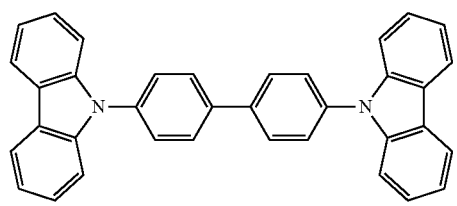

(8)

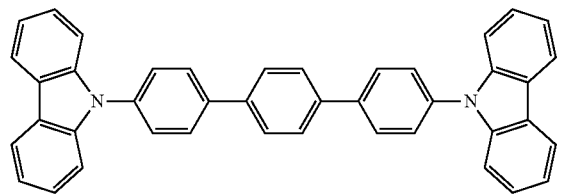

(9)

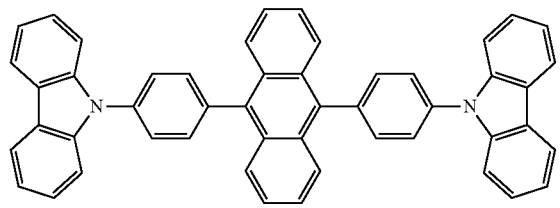

(10)

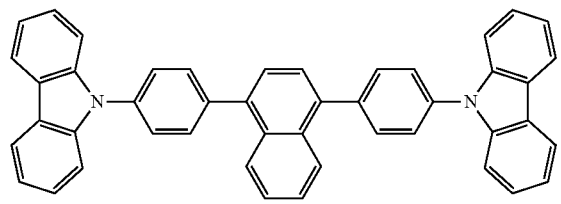

(11)

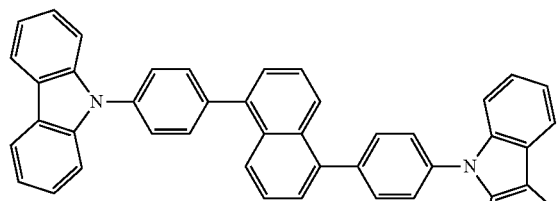

(12)

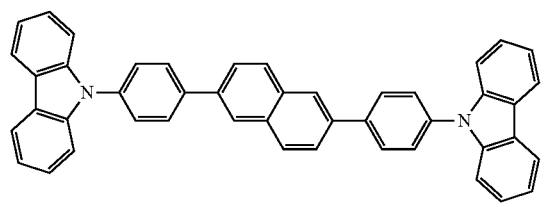

(13)

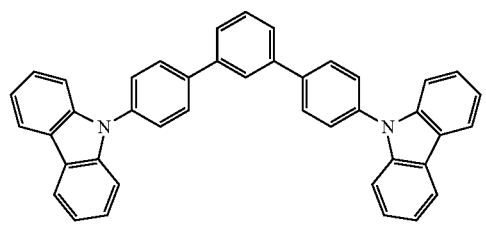

(14)

-continued
(15)
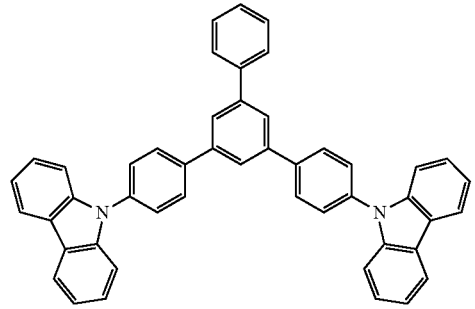
(16)
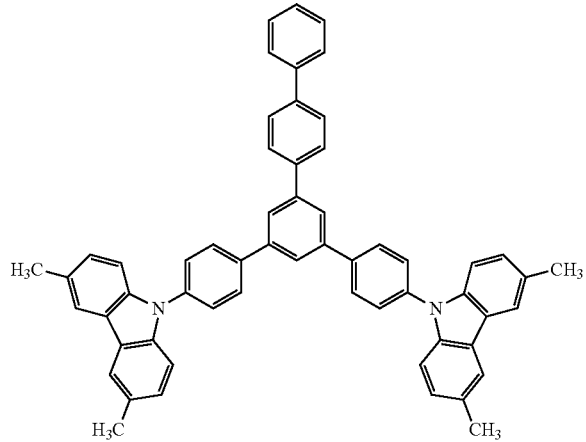
(17)
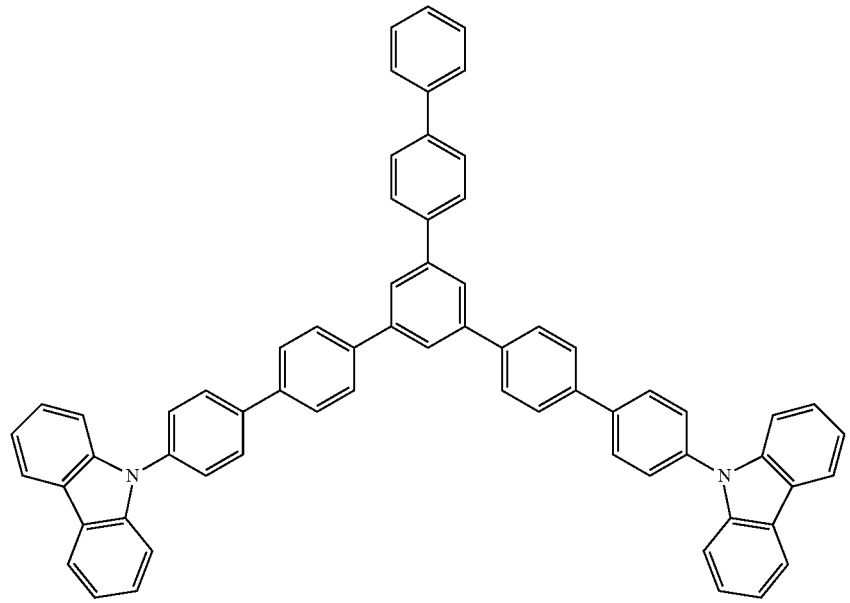
(18)
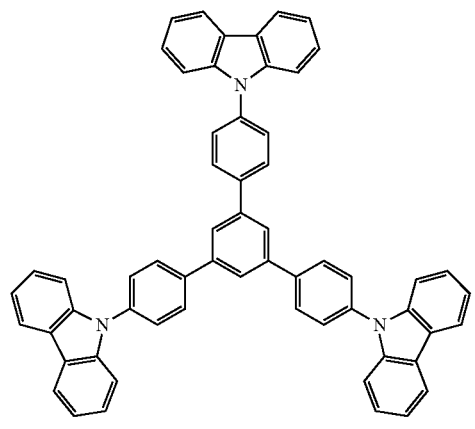
(19)
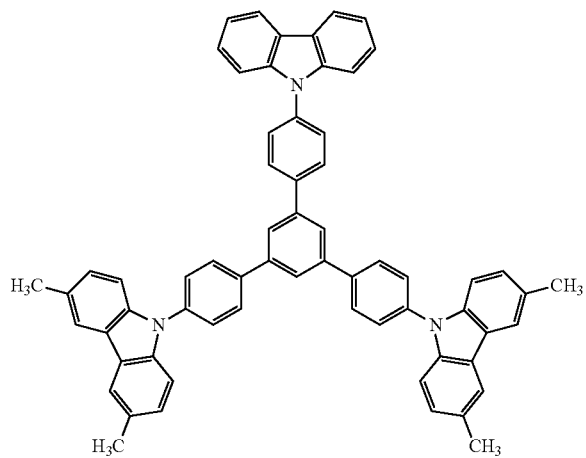

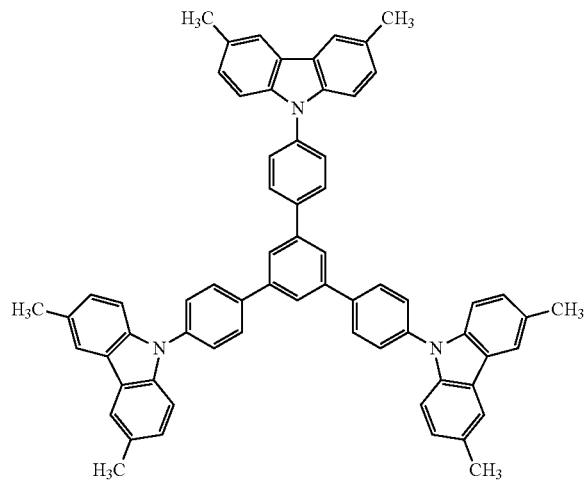
(20)
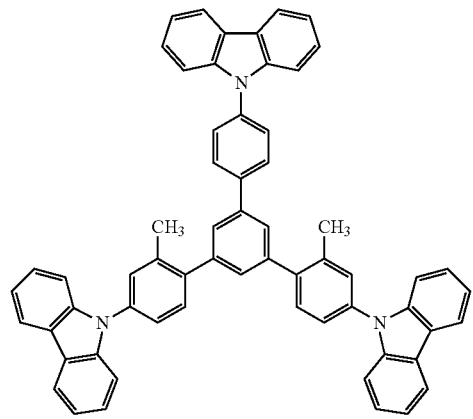
(21)
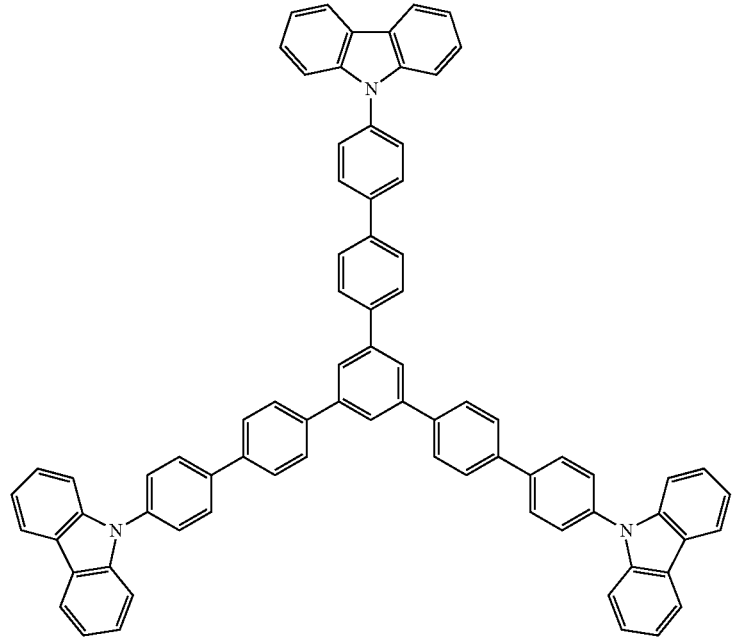
(22)

-continued

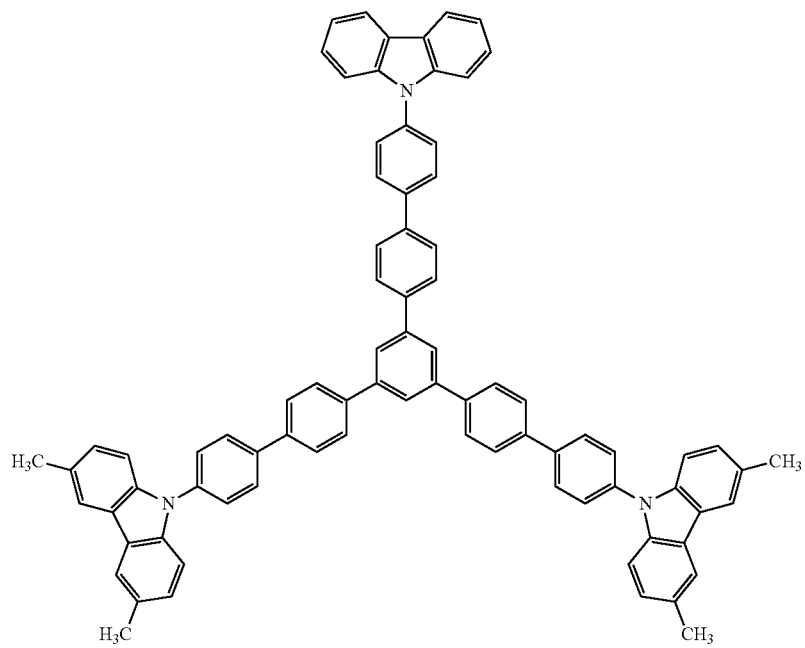

(23)

Subsequently, inorganic compounds that can be used for the composite material of the present invention will be described. For the composite material of the present invention, an oxide of a transition metal can be used as the inorganic compound. Preferably, it is desirable to use an oxide of a metal belonging to group 4 to 8 of the periodic table. Vanadium oxide, tantalum oxide, molybdenum oxide, tungsten oxide, rhenium oxide, and ruthenium oxide are particularly preferable. The oxide of molybdenum is particularly easy to handle among them, because it is easily deposited, and is stable.

The composite material of the present invention including the above mentioned organic compound and inorganic compound has an excellent carrier transporting property, an excellent carrier injecting property to the organic compound, as well as excellent transparency.

Also, since the composite material of the present invention has an excellent carrier transporting property, and an excellent carrier injecting property to the organic compound, it can be used for semiconductor elements such as light emitting elements, photoelectric conversion elements, and thin film transistors.

Further, since the composite material of the present invention has an excellent carrier transporting property, and an excellent carrier injecting property to the organic compound, a light emitting element using the composite material of the present invention can be reduced in driving voltage.

Furthermore, a light emitting element and a photoelectric conversion element using the composite material of the present invention can be efficient elements since the composite material of the present invention has excellent transparency.

Embodiment Mode 2

A light emitting element of the present invention will be described. The light emitting element of the present invention includes a layer containing a light emitting substance and a layer formed of a composite material between a pair of electrodes. Note that the composite material is the composite material of the present invention described in Embodiment Mode 1.

One example of a structure of the light emitting element of the present invention is shown in FIG. 1. The structure is that of interposing a light emitting laminated body 103 between a first electrode 101 and a second electrode 102. In this embodiment mode, a case where the first electrode 101 is an electrode functioning as an anode and the second electrode 102 is an electrode functioning as a cathode is described. For the first electrode 101 and the second electrode 102, a metal, an alloy, or an electroconductive compound can be used. For example, a metal having a conductive property such as aluminum (Al), silver (Ag), gold (Au), platinum (Pt), nickel (Ni), tungsten (W), chromium (Cr), molybdenum (Mo), iron (Fe), cobalt (Co), copper, (Cu), palladium (Pd), lithium (Li), cesium (Cs), magnesium (Mg), calcium (Ca), strontium (Sr), titanium (Ti); an alloy such as an alloy of aluminum and silicon (Al—Si), an alloy of aluminum and titanium (Al—Ti), an alloy of aluminum, silicon, and copper (Al—Si—Cu); a nitride of a metal material such as titanium nitride (TiN); or a metal compound such as indium tin oxide (ITO), ITO containing silicon (ITSO), or indium zinc oxide (IZO) in which indium oxide is mixed with zinc oxide (ZnO) can be used. However, among them, using a material that has a high work function (work function of 4.0 eV or higher) for the electrode functioning as the anode is desirable, and using a material that has a low work function (work function of 3.8 eV or lower) for the electrode functioning as the cathode is desirable.

The light emitting laminated body 103 has a structure of stacking a first layer 111 and a second layer 112.

The first layer 111 takes on a function of transporting holes to the second layer 112, and it is a layer formed of the composite material of the present invention described in Embodiment Mode 1. Since the composite material of the present invention exhibits excellent hole injecting property and hole transporting property, the driving voltage of the light emitting element can be reduced. Note that since the first layer 111 including the composite material of the present invention has excellent hole transporting property and hole injecting property, it is preferable to provide it between the anode and a layer taking on a light emitting function. In this embodiment mode, a case where the first layer 111 is provided so as to be in contact with the first electrode 101 functioning as the anode is described.

For an organic compound and an inorganic compound that are included in the composite material, those described in Embodiment Mode 1 may be used.

Also, because the composite material has high conductivity, a rise in driving voltage can be suppressed even when film thickness is increased. Consequently, since the first layer 111 can increase in thickness without causing a rise in driving voltage, short-circuiting of the element due to dust and the like can be suppressed. Such an effect is effective when the thickness of the first layer 111 is 60 nm or more.

Further, since the composite material includes an inorganic compound, heat resistance of the light emitting element can be improved.

The second layer 112 is a layer that takes on a light emitting function. The second layer 112 may be formed with a single layer or with a plurality of layers. For example, other than a light emitting layer, a functional layer such as an electron injecting layer, an electron transporting layer, a hole blocking layer, a hole transporting layer, and/or a hole injecting layer may be freely combined and provided. Also, for the second layer 112, a known material can be used, and a low molecular material or a high molecular material can also be used. Note that as a structure of a material forming the second layer 112, not only a structure of an organic compound material alone is included, but a structure partly containing an inorganic compound material, is also included. By the second layer 112 also having a structure including an inorganic compound, an effect of increasing heat resistance even more, can be obtained.

For a material having a hole injecting property that forms the hole injecting layer, a substance having a hole transporting property in which its ionization potential is relatively smaller than that of a functional layer that is formed to be in contact with the hole injecting layer on the other side of an electrode functioning an the anode, can be used. The material having a hole injecting property is determined relative to the ionization potential, and as examples of substances that are often used for the hole injecting layer, metal oxides such as vanadium oxide, molybdenum oxide, ruthenium oxide, and aluminum oxide can be given. Alternatively, if an organic compound is used, a porphyrin based compound is effective, and phthalocyanine (abbreviation: $H_2Pc$), copper phthalocyanine (abbreviation: CuPc), or the like can be used. Also, there are materials of conductive high molecular compounds for which chemical doping has been carried out, and polyethylene dioxythiophene (abbreviation: PEDOT) and polyaniline (abbreviation: PAni) that are doped with polystyrene sulfonate (abbreviation: PSS), can be used.

There are no particular limits to a material having a hole transporting property that forms the hole transporting layer, and as specific examples, 4,4'-bis[N-(1-naphthyl)-N-phenylamino]biphenyl (abbreviation: NPB); 4,4'-bis[N-(3-methylphenyl)-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis{N-[4-(N,N-di-m-tolylamino)phenyl]-N-phenylamino}biphenyl (abbreviation: DNTPD); 1,3,5-tris[N,N-di(m-tolyl)amino]benzene (abbreviation: m-MTDAB); 4,4',4''-tris(N-carbazolyl)triphenylamine (abbreviation: TCTA); phthalocyanine (abbreviation: $H_2Pc$); copper phthalocyanine (abbreviation: CuPc); vanadyl phthalocyanine (abbreviation: VOPc); or the like can be given. An aromatic amine based compound (in other words, having a benzene ring-nitrogen bond) is particularly preferable.

The light emitting layer includes a light emitting substance, and the light emitting substance is herein a substance that has good light efficiency, and is able to emit light of a desired emission wavelength. Although the light emitting layer is not particularly limited, it is preferable that it is a layer in which the light emitting substance is dispersed and included in a layer formed of a substance having a larger energy gap than the energy gap of the light emitting substance. This layer can prevent light emitted from the light emitting substance from going out due to the concentration of the light emitting substance. Note that the energy gap refers to an energy gap between the LUMO level and the HOMO level.

The light emitting substance that forms the light emitting layer is not particularly limited, and a substance having good light emitting efficiency that is able to emit light of a desired emission wavelength may be used. For example, in order to emit red light, the following substances exhibiting emission spectrum with peaks at 600 to 680 nm can be employed: 4-dicyanomethylene-2-isopropyl-6-[2-(1,1,7,7-tetramethyl-julolidine-9-yl)ethenyl]-4H-pyran (abbreviation: DCJTI); 4-dicyanomethylene-2-methyl-6-[2-(1,1,7,7-tetramethyljulolidine-9-yl)ethenyl]-4H-pyran (abbreviation: DCJT); 4-dicyanomethylene-2-tert-butyl-6-[2-(1,1,7,7-tetramethyljulolidine-9-yl)ethenyl]-4H-pyran (abbreviation: DCJTB); periflanthene; 2,5-dicyano-1,4-bis[2-(10-methoxy-1,1,7,7-tetramethyljulolidine-9-yl)ethenyl]benzene; and the like. In order to obtain green light emission, substances exhibiting emission spectrum with peaks at 500 to 550 nm such as N,N'-dimethylquinacridon (abbreviation: DMQd), coumarin 6, coumarin 545T, and tris(8-quinolinolate) aluminum (abbreviation: $Alq_3$) can be employed. In order to obtain blue light emission, the following substances exhibiting emission spectrum with peaks at 420 to 500 nm can be employed: 9,10-bis(2-naphthyl)-tert-butylanthracene (abbreviation: t-BuDNA); 9,9'-bianthryl; 9,10-diphenylanthracene (abbreviation: DPA); 9,10-bis(2-naphthyl)anthracene (abbreviation: DNA); bis(2-methyl-8-quinolinolate)-4-phenylphenolate-gallium (abbreviation: BGaq); bis(2-methyl-8-quinolinolate)-4-phenylphenolate-aluminum (abbreviation: BAlq); and the like. In addition to the above mentioned substances emitting fluorescence, the following substances emitting phosphorescence can be used as the light emitting substance: bis[2-(3,5-bis(trifluoromethyl)phenyl)pyridinato-N,$C^{2'}$]iridium(III) picolinate (abbreviation: $Ir(CF_3ppy)_2(pic)$); bis[2-(4,6-difluorophenyl)pyridinato-N,$C^{2'}$]iridium(III) acetylacetonate (abbreviation: FIr(acac)); bis[2-(4,6-difluorophenyl)pyridinato-N,$C^{2'}$]iridium(III) picolinate (FIr(pic)); tris(2-phenylpyridinato-N,$C^{2'}$)iridium (abbreviation: $Ir(ppy)_3$); and the like.

A substance used for dispersing a light emitting substance is not particularly limited. For example, an anthracene derivative such as 9,10-di(2-naphthyl)-2-tert-butylanthracene (abbreviation: t-BuDNA), a carbazole derivative such as 4,4'-bis(N-carbazolyl)biphenyl (abbreviation: CBP), a metal complex such as bis[2-(2-hydroxyphenyl)pyridinato]zinc (abbreviation: $Znpp_2$) and bis[2-(2-hydroxyphenyl)benzoxazolato]zinc (abbreviation: ZnBOX), and the like can be used.

As a material having an electron transporting property that is used for forming the electron transporting layer, a known material can be used. Specifically, a representative metal complex such as tris(8-quinolinolato) aluminum (abbreviation: $Alq_3$); tris(4-methyl-8-quinolinolato) aluminum (abbreviation: $Almq_3$); bis(10-hydroxybenzo[h]-quinolinato) beryllium (abbreviation: $BeBq_2$); bis(2-methyl-8-quinolinolato)-(4-hydroxy-biphenyl)-aluminum (abbreviation: BAlq); bis[2-(2-hydroxyphenyl)-benzoxazolate]zinc (abbreviation: $Zn(BOX)_2$); and bis[2-(2-hydroxyphenyl)-benzothiazolate] zinc (abbreviation: $Zn(BTZ)_2$) can be given. In addition, a hydrocarbon compound such as 9,10-diphenylanthracene and 4,4'-bis(2,2-diphenylethenyl)biphenyl is preferably employed. Alternatively, a triazole derivative such as 3-(4-tert-butylphenyl)-4-(4-ethylphenyl)-5-(4-biphenyl)-1,2,4-triazole; a phenanthroline derivative such as bathophenanthroline and bathocuproin may be used.

As a material having an electron injecting property that is used to form the electron injecting layer, a known material can be used. Specifically, alkali metal salt and alkali earth metal salt such as calcium fluoride, lithium fluoride, lithium oxide and lithium chloride are preferable. Alternatively, a layer in which a donor compound such as lithium is added to the material having an electron transporting property, such as tris(8-quinolinolato) aluminum (abbreviation: $Alq_3$) and bathocuproin (abbreviation: BCP) can be used.

Note that in this embodiment mode, since the first layer 111 takes on a function of a hole injecting layer, it is not necessary to provide the hole injecting layer for the second layer 112.

In this embodiment mode, a dopant that contributes to light emission is added only to the light emitting layer and light emitted from the dopant alone is observed. However, a dopant exhibiting a different light emission may be added to another layer for example the electron transporting layer or the hole transporting layer. When a color of light emitted from the light emitting layer and a color of light emitted from the dopant added to another layer are complementary to each other, white light emission can be obtained.

By changing the type of at least one of the first electrode 101 and the second electrode 102, the light emitting element of this embodiment mode has diverse variations. Schematic views of the variations are shown in FIGS. 3A to 3C and FIGS. 4A to 4C. Note that the reference numerals used in FIG. 1 are also used in FIGS. 3A to 3C and FIGS. 4A to 4C. Further, reference numeral 100 represents a substrate that supports the light emitting element of the present invention.

Figure 3A:
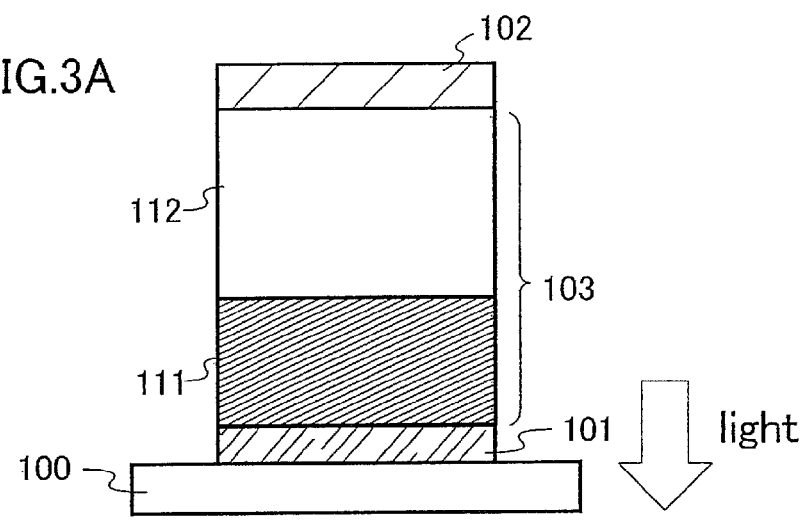
FIGS. 3A to 3C describe a light emitting element of the present invention.
Figure 3B:
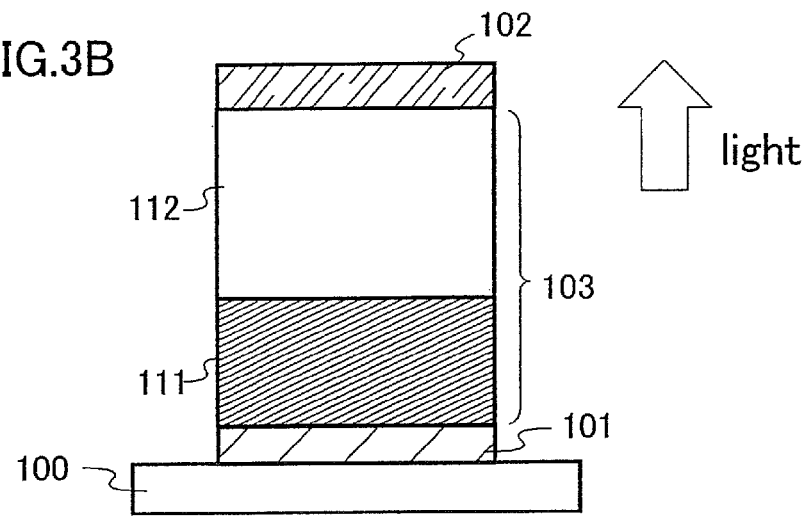
Figure 3C:
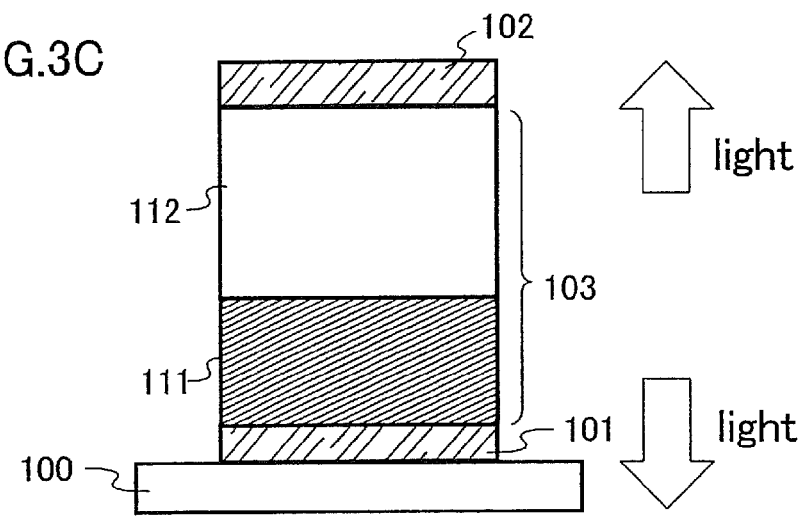

Each of FIGS. 3A to 3C shows an example where a light emitting laminated body 103 is structured by a first layer 111 and a second layer 112 in this sequence, from a substrate 100 side. At this time, by using a material having a light transmitting property for the first electrode 101 and using a material having a light shielding property (in particular, a material also having a reflecting property) for the second electrode 102, light is taken out from the substrate 100 side as shown FIG. 3A. Further, by using a material having a light shielding property (in particular, a material also having a reflecting property) for a first electrode 101, and using a material having a light transmitting property for a second electrode 102, light can be taken out from the side opposite the substrate 100, as shown in FIG. 3B. Furthermore, by forming the first electrode 101 and the second electrode 102 so that both have light transmitting properties, light can also be emitted from the substrate 100 side and the side opposite the substrate 100, as shown in FIG. 3C.

Each of FIGS. 4A to 4C shows an example where a light emitting laminated body 103 is structured by a second layer 112 and a first layer 111, in this sequence from a substrate 100 side. At this time, by forming a first electrode 101 to have a light shielding property (in particular, a material also having a reflecting property) and forming a second electrode 102 to have a light transmitting property, light can be emitted from the substrate 100 side as shown in FIG. 4A. Further, by using a material having a light transmitting property for the first electrode 101, and using a material having a light shielding property (in particular, a material also having a reflecting property) for a second electrode 102, light can be emitted from the side opposite the substrate 100, as shown in FIG. 4B. Furthermore, by forming the first electrode 101 and the second electrode 102 so that both have light transmitting properties, light can also be emitted from the substrate 100 side and the side opposite the substrate 100, as shown in FIG. 4C.

In the light emitting element of this embodiment mode, since the first layer 111 is formed with the composite material described in Embodiment Mode 1, extremely strong hole injecting property and hole transporting property are exhibited. Consequently, even if the first layer 111 increases in thickness, a rise in driving voltage can be suppressed. Therefore, rise in driving voltage can be suppressed, and a short circuit of the light emitting element can be prevented. Further, because of an improvement in color purity by optical design, the film thickness of the first layer 111 can be freely set. Furthermore, since the first layer 111 is formed with the composite material described in Embodiment Mode 1 which has high transparency, the light emitting element of the present invention can be formed to have good efficiency. Also, since a film that is formed of the composite material of the present invention has excellent transparency even when its thickness increases, an effect of absorption by the film due to increase in thickness is small, and a light emitting element having good efficiency can be formed even when carrying out a short circuit prevention measure or optical design. The short circuit prevention measure is effective when the thickness of the first layer 111 is 60 nm or more.

Also, as in the structures of FIGS. 3A to 3C, when the second electrode 102, the second layer 112, and the first layer 111 are formed in this sequence, and then the first electrode 101 is formed by sputtering, damage to the second layer 112 which is where a light emitting substance exists, can be reduced.

Embodiment Mode 3

In this embodiment mode, a manufacturing method of the light emitting element shown in Embodiment Mode 2 will be described.

First, the first electrode 101 is formed. The first electrode 101 may be appropriately formed using a material such as those mentioned in Embodiment Mode 2, by a known method such as a sputtering method or an evaporation method.

Next, the first layer 111 is formed. A formation method of the first layer 111 is not particularly limited; however, it can be formed by co-evaporation of an organic compound and an inorganic compound which can be used for the composite material described in Embodiment Mode 1.

Then, the second layer 112 is formed. The second layer 112 can be formed by a known method and by using a known material; however formation by an evaporation method is common.

The second electrode 102 can be formed by a known method and by using a known material. Specifically, the materials listed in Embodiment Mode 2 as the materials for the first electrode 101 and the second electrode 102 can be used, and may be formed by a known method such as a sputtering method or an evaporation method. An evaporation method is a preferable method because it particularly has few damages to the second layer. It is acceptable as long as one of the first electrode 101 and the second electrode 102, or both have light transmitting properties.

A light emitting element of the present invention can be manufactured by following the above method. Note that in this embodiment mode, a method of forming starting from the first electrode 101 is described; however, the light emitting element may be manufactured sequentially starting from the second electrode 102.

Embodiment Mode 4

In this embodiment mode, a case of providing a layer formed of the composite material between an anode and a light emitting layer, yet so as not to be in contact with the anode, will be described.

Figure 2:
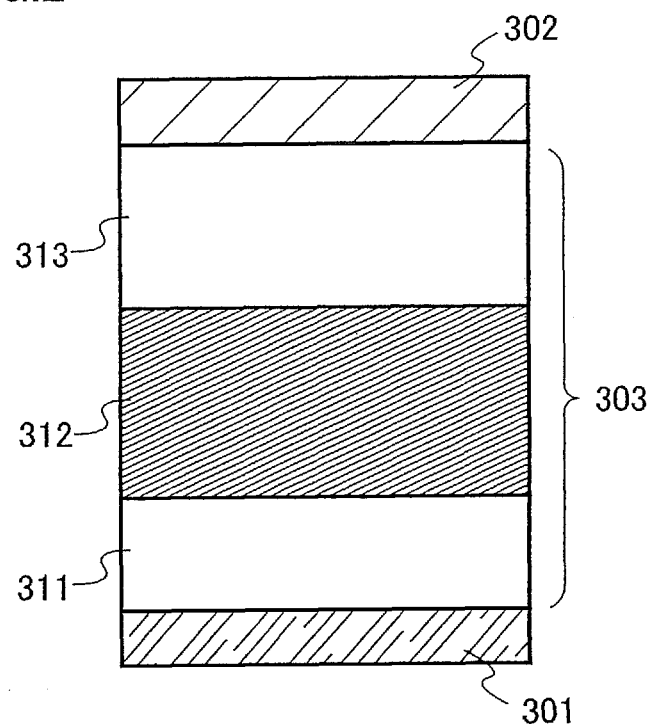
FIG. 2 describes a light emitting element of the present invention.

FIG. 2 shows an example of a structure for a light emitting element of the present invention. The structure is that of interposing a light emitting laminated body 303 between a first electrode 301 and a second electrode 302. The light emitting laminated body 303 has a structure of stacking a first layer 311, a second layer 312, and a third layer 313. In this embodiment mode, a case where the first electrode 301 functions as an anode and the second electrode 302 functions as a cathode will be described.

The first layer 311 is a layer that has a function of injecting holes. As a material having a hole injecting property for forming the hole injecting layer, a known material can be used. Specifically, the materials having hole injecting properties described in Embodiment Mode 2 can be used.

The second layer 312 is a layer that is formed of the composite material described in Embodiment Mode 1. The same structure as the first layer 111 described in Embodiment Mode 2 can be applied.

The third layer 313 takes on a light emitting function, and the same structure as the second layer 112 described in Embodiment Mode 2 can be applied.

In the light emitting element of this embodiment mode, since the second layer 312 is formed by the composite material described in Embodiment Mode 1, extremely strong hole injecting property and hole transporting property are exhibited. Therefore, an increase in driving voltage can be suppressed even when the thickness of the second layer 312 is increased. Consequently, a rise in driving voltage can be suppressed, and prevent a short circuit of the light emitting element. Further, because of an improvement in color purity by optical design, the film thickness of the second layer 312 can be freely set. Furthermore, since the second layer 312 is formed with the composite material described in Embodiment Mode 1 which has high transparency, the light emitting element of the present invention can be formed to have good efficiency. Also, since a film that is formed of the composite material of the present invention has excellent transparency even when its thickness increases, an effect of absorption of the film due the increase in thickness is small, and a light emitting element having good efficiency can be formed even when carrying out a short circuit prevention plan or optical design. The short circuit prevention is effective when the thickness of the second layer 312 is 60 nm or more.

Embodiment Mode 5

In this embodiment mode, a light emitting element having a different structure than another described structure, will be described with reference to FIG. 5.

Figure 5:
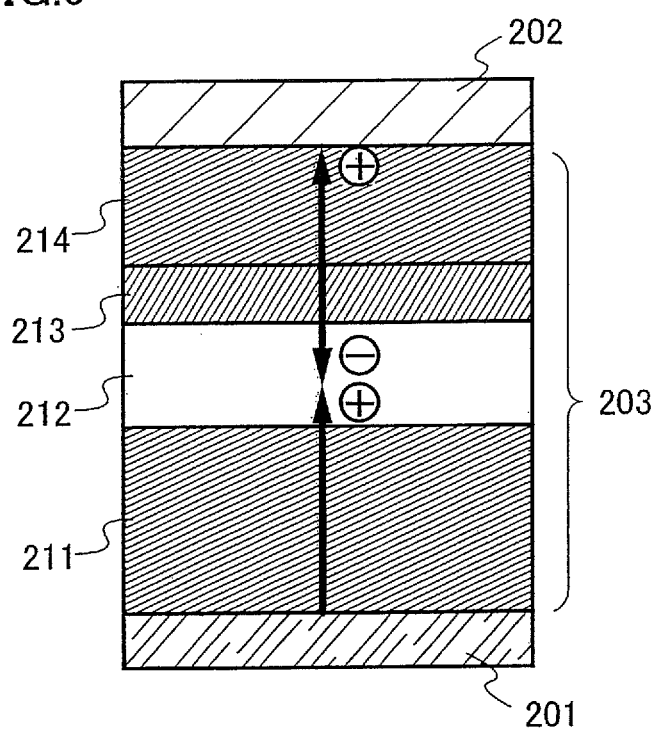
FIG. 5 describes a light emitting element of the present invention.

FIG. 5 shows one example of a structure for a light emitting element of the present invention. The structure is that of interposing a light emitting laminated body 203 between a first electrode 201 and a second electrode 202. The light emitting laminated body 203 has a structure of stacking a first layer 211, a second layer 212, a third layer 213, and a fourth layer 214, in this sequence. In this embodiment mode, a case where the first electrode 201 functions as an anode, and the second electrode functions as a cathode is described.

The light emitting element of this embodiment mode operates in the following manner. First, by applying voltage so that the electrical potential of the first electrode 201 is higher than that of the second electrode 202, holes are injected to the second electrode 202 from the fourth layer 214, and electrons are injected to the second layer 212 from the third layer 213. Also, holes are injected to the first layer 211 from the first electrode 201, and holes are injected to the second layer 212 from the first layer 211. The holes that are injected from the first layer 211 and the electrons that are injected from the third layer 213 are recombined in the second layer 212, so that a light emitting substance is excited. Then, the light emitting substance emits light upon returning to a ground state from the excited state.

For the first electrode 201, the second electrode 202, the first layer 211, and the second layer 212, the same structures as those of the first electrode 101, the second electrode 102, the first layer 111, and the second layer 112 in Embodiment Mode 2 can be applied, respectively. In other words, a known material can be used for the first electrode, the first layer 211 is a layer that is formed with the composite material described in Embodiment Mode 1, and the second layer 212 is a layer that takes on a light emitting function.

The third layer 213 is a layer including a material having a donor level that generates electrons. As such a layer, for example, a layer that contains an electron transporting substance and a substance exhibiting an electron donating property with respect to the substance can be given. The electron transporting substance mentioned here is a substance which has a stronger electron transporting property than a hole transporting property. The electron transporting substance is not particularly limited. For example, a metal complex such as tris(8-quinolinolato) aluminum (abbreviation: $Alq_3$), tris (4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl)benzoxazolato]zinc (abbreviation: $Zn(BOX)_2$), and bis [2-(2-hydroxyphenyl)benzothiazolato]zinc (abbreviation: $Zn(BTZ)_2$) can be given. In addition, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used. Also, there are no particular limits to the substance exhibiting an electron donating property with respect to the electron transporting substance. For example, alkali metals such as lithium and cesium; alkali earth metals such as magnesium and calcium; rare-earth metal such as erbium and ytterbium and the like can be used. Further, a substance selected from alkali metal oxides and alkali earth metal oxides such as lithium oxide ($Li_2O$), calcium oxides (CaO), sodium oxide ($Na_2O$), potassium oxide ($K_2O$), and magnesium oxide (MgO), may be used as the substance exhibiting an electron donating property with respect to the electron transporting substance. Note that alkali metal oxides, alkali earth metal oxides, and the like are easy to handle, since they have low reactivity. Also, the second layer 312 may be a layer formed with an n-type semiconductor such as zinc oxide, zinc sulfide, zinc selenide, tin oxide or titanium oxide.

The fourth layer 214 has a structure that includes an organic compound, and an inorganic compound exhibiting an electron accepting property with respect to the organic compound. Therefore, the same inorganic compounds listed in Embodiment Mode 1 can be used as the inorganic compound that is included in the fourth layer. However, the inorganic compound that is included in the fourth layer 214 may be the same as the inorganic compound that is included in the first layer 211, or a different inorganic compound may be used.

Further, since the first layer 211 and the fourth layer 214 are formed using the composite material of the present invention, strong hole injecting property and hole transporting property are exhibited. Consequently, a rise in driving voltage can be suppressed even when the thickness of the first layer 211 is increased. Therefore, in the light emitting element of this embodiment mode, layers on both sides of the second layer 212 that takes on a light emitting function can be extremely thick, and further, a short circuit of the light emitting element can be effectively prevented. Also, because of an improvement in color purity by optical design, the film thickness of layers on both sides of the second layer 212 can be freely set. Further, in a case of forming the first electrode 201 or the second electrode 202 by sputtering after forming the light emitting laminated body 203, damage to the second layer 212 which is where the light emitting substance exists, can be reduced. Furthermore, by forming the first layer 211 and the fourth layer 214 with the same material, both sides of the light emitting laminated body 203 is formed with the same material, and an effect of suppressing distortion caused by stress can also be expected. Also, since the composite material of the present invention which has high transparency is used for the first layer 211 and the fourth layer 214, the light emitting element of the present invention in this embodiment mode is an efficient light emitting element.

Note that by changing the type of at least one of the first electrode 201 and the second electrode 202, the light emitting element of this embodiment mode also has diverse variations. Schematic views of the variations are shown in FIGS. 6A to 6C and FIGS. 7A to 7C. Note that the reference numerals used in FIG. 5 are also used in FIGS. 6A to 6C and FIGS. 7A to 7C. Further, reference numeral 200 represents a substrate that supports the light emitting element of the present invention.

FIGS. 6A to 6C each show an example of a case where a light emitting laminated body 203 is structured by a first layer 211, a second layer 212, a third layer 213, and a fourth layer 214 in this sequence, from a substrate 200 side. At this time, by using a material having a light transmitting property for a first electrode 201, and using a material having a light shielding property (in particular, a material also having a reflecting property) for a second electrode 202, light is emitted from the substrate 200 side, as in FIG. 6A. Further, by using a material having a light shielding property (in particular, a material also having a reflecting property) for the first electrode 201, and using a material having a light transmitting property for the second electrode 202, light is emitted from the side opposite the substrate 200, as shown in FIG. 6B. Furthermore, by forming the first electrode 201 and the second electrode 202 so that both have light transmitting properties, light can also be emitted from the substrate 200 side and the side opposite the substrate 200, as shown in FIG. 6C.

Each of FIGS. 7A to 7C shows an example where a light emitting laminated body 203 is structured by a fourth layer 214, a third layer 213, a second layer 212, and a first layer 211, in this sequence from a substrate 200 side. At this time, by using a material having a light shielding property (in particular, a material also having a reflecting property) for a first electrode 201, and using a material having a light transmitting property for a second electrode 202, light is taken out from the substrate 200 side as shown in FIG. 7A. Further, by using a material having a light transmitting property for the first electrode 201 and using a material having a light shielding property (in particular, a material also having a reflecting property) for the second electrode 202, light can be taken out from the side opposite the substrate 200, as shown in FIG. 7B. Furthermore, by forming the first electrode 201 and the second electrode 202 so that both have light transmitting properties, light can also be emitted from the substrate 200 side and the side opposite the substrate 200, as shown in FIG. 7C.

Note that when manufacturing the light emitting element of this embodiment mode, it can be manufactured according to the method described in Embodiment Mode 3.

Also, the first layer 211, the second layer 212, the third layer 213, and the fourth layer 214 may be stacked in this sequence after forming the first electrode 201, and then the second electrode may be formed; or the fourth layer 214, the third layer 213, the second layer 212, and the first layer 211 may be stacked in this sequence after forming the second electrode 202, and then the first electrode 201 may be formed.

Note that the structure can be that of forming the first layer 211 using a material having a donor level that generates electrons; forming the third layer 213 using the composite material of the present invention; and forming the fourth layer 214 using a material including a material having a donor level that generates electrons. In this case, the third layer 213 has an excellent hole transporting property since it is formed using the composite material of the present invention. Therefore, driving voltage of the light emitting element can be reduced. Also, because of an improvement in color purity by optical design, the film thickness of the third layer 213 can be freely set. Further, because the third layer 213 uses the composite material of the present invention which has high transparency, an efficient light emitting element can be formed. Furthermore, since a film that is formed of the composite material of the present invention has excellent transparency even when its thickness increases, an effect of absorption by the film due to increase in thickness is small, and a light emitting element having good efficiency can be formed even when carrying out a short circuit prevention plan or optical design. The short circuit prevention measure is effective when the thickness of the third layer 213 is 60 nm or more.

Embodiment Mode 6

In this embodiment mode, a structure of a light emitting element in which a plurality of layers taking on a light emitting function sandwiching a layer made of the composite material, is described.

FIG. 11 shows an example of a structure for the light emitting element of the present invention. The structure is that of interposing a light emitting laminated body 403 between a first electrode 401 and a second electrode 402. The light emitting laminated body 403 has a structure of stacking a first layer 411, a second layer 412, and a third layer 413, and a fourth layer 414. In this embodiment mode, a case where the first electrode 401 functions as an anode, and the second electrode 402 functions as a cathode is described.

The light emitting element of this embodiment mode operates in the following manner. First, by applying voltage so that the electrical potential of the first electrode 401 is higher than that of the second electrode 402, holes are injected to the first layer 411 from the first electrode 401, electrons are injected to the first layer 411 from the second layer 412, holes are injected to the fourth layer 414 from the third layer 413, and electrons are injected to the fourth layer 414 from the second electrode 402. The holes that are injected from the first electrode 401 and the electrons that are injected from the second layer 412 are recombined in the first layer 411, so that a light emitting substance is excited. Then, the light emitting substance emits light upon returning to a ground state from the excited state. Further, holes that are injected from the third layer 413 and electrons that are injected from the second electrode 402 also recombine in the fourth layer 414 so that a light emitting substance in the fourth layer 414 is excited, and light emission can be obtained.

The first layer 411 is a first layer taking on a light emitting function, and the fourth layer 414 is a second layer taking on a light emitting function. The same structure can be applied to the first layer taking on a light emitting function and the second layer taking on a light emitting function, as the structure of the second layer 112 described in Embodiment Mode 2. As for the layer structures of each of the first layer taking on a light emitting function and the second layer taking on a light emitting function, they may be the same or different from each other. Also, a color of light emitted from a light emitting layer in the first layer having a light emitting function, and a color of light emitted from a light emitting layer in the second layer having a light emitting function may be the same or different. If the two layers have the same colors of emitted light, then twice the luminance can be obtained with the same current density. Furthermore, by the two layers having different colors of emitted light, light emission of a color in which the two colors are mixed can be obtained.

The second layer 412 is a layer that includes a material having a donor level that generates electrons, and the same structure as that of the third layer 213 described in Embodiment Mode 5 can be applied. The third layer 413 is a layer that is formed using the composite material described in Embodiment Mode 1. Since the third layer 413 is a layer that is formed by using the composite material of the present invention, it has excellent transparency, loss of emitted light is little even when it is interposed between the first layer taking on a light emitting function and the second layer taking on a light emitting function, and a light emitting element with better efficiency can be formed.

Note that when manufacturing the light emitting element of this embodiment mode, it can be manufactured according to the method described in Embodiment Mode 3.

Note that this embodiment mode can be used by appropriately and freely combining it with Embodiment Modes 1 to 5.

Embodiment Mode 7

In this embodiment mode, a light emitting device having a light emitting element of the present invention will be described.

Figure 9A:
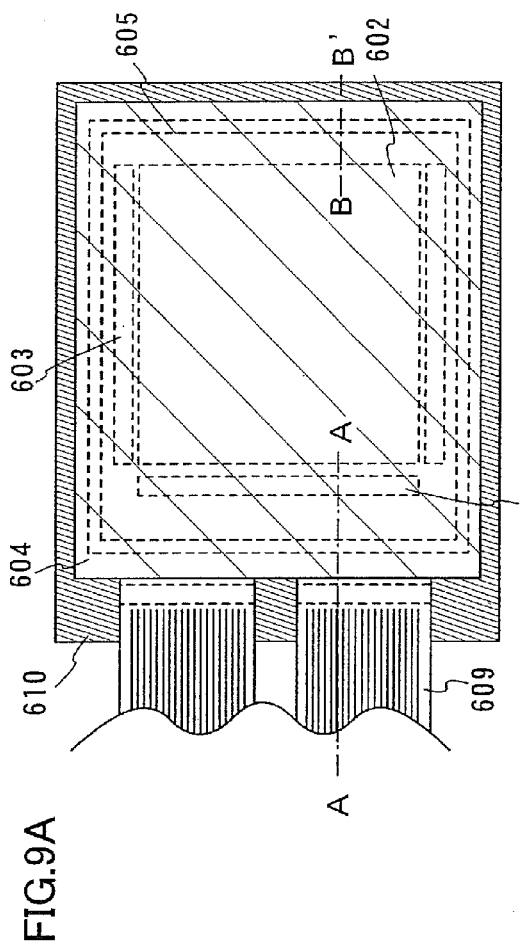
FIGS. 9A and 9B describe a light emitting device.
Figure 9B:
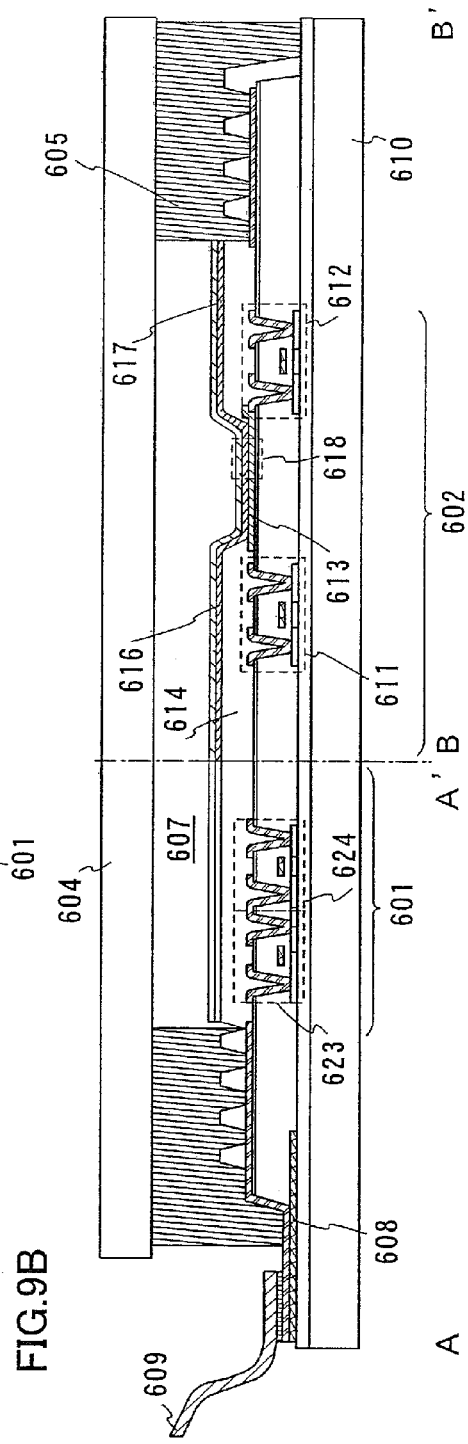

In this embodiment, a light emitting device having the light emitting element of the present invention in a pixel region is described with reference to FIGS. 9A and 9B. Note that FIG. 9A is a top view showing the light emitting device, and FIG. 9B is a cross-sectional view of the figure in FIG. 9A along the lines A-A' and B-B'. A reference numeral 601 shown by dotted line represents a driving circuit portion (source side driving circuit), a reference numeral 602 represents a pixel portion, and a reference numeral 603 represents a driving circuit portion (gate side driving circuit). Also, a reference numeral 604 represents a sealing substrate, a reference numeral 605 represents a sealant, and the inside that is surrounded by the sealant 605 is a space 607.

Note that a leading wiring 608 is a wiring for transmitting a signal that is inputted into the source side driving circuit 601 and the gate side driving circuit 603, and video signals, clock signals, start signals, reset signals and the like are received from an FPC (flexible print circuit) 609, which is a external input terminal. Although only the FPC is shown in the figures, a print wiring board (PWB) may be attached to this FPC. The light emitting device in this specification includes not only the principal body of the light emitting device, but also conditions in which an FPC or a PWB attached to it.

Subsequently, a cross-sectional structure is described with reference to FIG. 9B. The driving circuit portions and the pixel portion are formed over an element substrate 610; however, the source side driving circuit 601 that is a driving circuit portion, and a single pixel of the pixel portion 602 are shown herein.

A CMOS circuit combining an n-channel type TFT 623 and a p-channel type TFT 624 is formed for the source side driving circuit 601. A TFT forming the driving circuit may be formed with a known CMOS circuit, a PMOS circuit, or a NMOS circuit. Although this embodiment mode shows a driver integrated type where the driving circuits are formed over a substrate, this structure is not absolutely necessary, and the driving circuits can be formed externally.

The pixel portion 602 is formed of a plurality of pixels including a current control TFT 612 and a first electrode 613 that is electrically connected to a drain thereof, and a switching TFT 611. Note that an insulator 614 is formed covering an end portion of the first electrode 613. A positive type photosensitive acrylic resin film is used herein to form the insulator.

Also, the insulator 614 is provided such that an upper end portion or a lower end portion of the insulator has a curved surface having curvature. For example, when a positive type photosensitive acrylic resin is used as a material for the insulator 614, it is preferable that only the upper end portion of the insulator 614 has a curved surface with a curvature radius (0.2 μm to 3 μm). Further, the insulator 614 can be formed using either a negative type photosensitive acrylic resin that becomes insoluble in an etchant due to light, or a positive photosensitive acrylic resin that becomes soluble in an etchant due to light.

A light emitting laminated body 616 and a second electrode 617 are each formed over the first electrode 613. Here, as a material for the first electrode 613 that functions as an anode in this embodiment mode, it is desirable to use a material having a large work function. For example, a single layer film such as an ITO film, an ITSO film, an IZO film, a titanium nitride film, a chromium film, a tungsten film, a Zn film or a Pt film can be used. In addition, a laminated layer including a titanium nitride film and a layer having aluminum as its main component; a three-layer structure of a titanium nitride film, a film having aluminum as its main component, and a titanium nitride film; or the like can be used. Note that with a laminated structure, resistance as a wiring is low, and good ohmic contact can be obtained.

The light emitting laminated body 616 includes a layer formed with the composite material that generates holes, which is described in Embodiment Mode 1. The composite material described in Embodiment Mode 1 has excellent carrier injecting property and carrier transporting property. Therefore, driving voltage for the light emitting element and the light emitting device can be reduced.

Further, as a material for the second electrode 617 (cathode) that is formed over the light emitting laminated body 616, a material having a small work function (Al, Ag, Li, Ca; or an alloy thereof, as in MgAg, MgIn, AlLi, $CaF_2$, or $Ca_3N_4$) is preferably used. In a case of transmitting light that is generated in the light emitting laminated body 616 through the second electrode 617, a lamination of a thin metal film for which the thickness is reduced, and a transparent conductive film (such as ITO, IZO, ITSO, or ZnO) is preferable to be used as the second electrode 617.

Further, by sticking together the sealing substrate 604 and the element substrate 610 with the sealant 605, the structure is that of providing a light emitting element 618 in the space 607 which is surrounded by the element substrate 610, sealing substrate 604, and the sealant 605. Note that in the space 607, there is also a structure in which it is filled with the sealant 605, in addition to a case in which an inert gas (such as nitrogen or argon) is filled.

It is preferable to use an epoxy resin for the sealant 605. Also, it is desirable that these materials do not transmit moisture or oxygen as much as possible. Further, as a material for the sealing substrate 604, a glass substrate or a quartz substrate can be used. In addition, a plastic substrate formed with FRP (Fiberglass-Reinforced Plastics), PVF (polyvinylfluoride), myler, polyester, acrylic, or the like can be used.

In the above manner, the light emitting device having the light emitting element of the present invention can be obtained.

Since the light emitting device of the present invention uses the composite material described in Embodiment Mode 1, driving voltage can be reduced. Therefore, it is possible to reduce power consumption.

Further, since the composite material described in Embodiment Mode 1 that is included in the light emitting element of the present invention has high conductivity, the light emitting laminated body 616 can be formed to be thick without causing a rise in driving voltage. Consequently, short-circuiting of the element due to dust and the like can be suppressed. Therefore, a light emitting device with fewer defects can be provided.

Since the composite material described in Embodiment Mode 1 that is included in the light emitting element of the present invention has excellent transparency, loss of emitted light due to forming a film of the material is little, and an efficient light emitting device can be formed. Also, since a film that is formed of the composite material of the present invention has excellent transparency even when its thickness increases, an effect of absorption by the film due to increase in thickness is small, and a light emitting element having good efficiency can be formed even when carrying out a short circuit prevention plan or optical design. The short circuit prevention is effective when the thickness of a layer formed with the composite material of the present invention is 60 nm or more.

Figure 8:
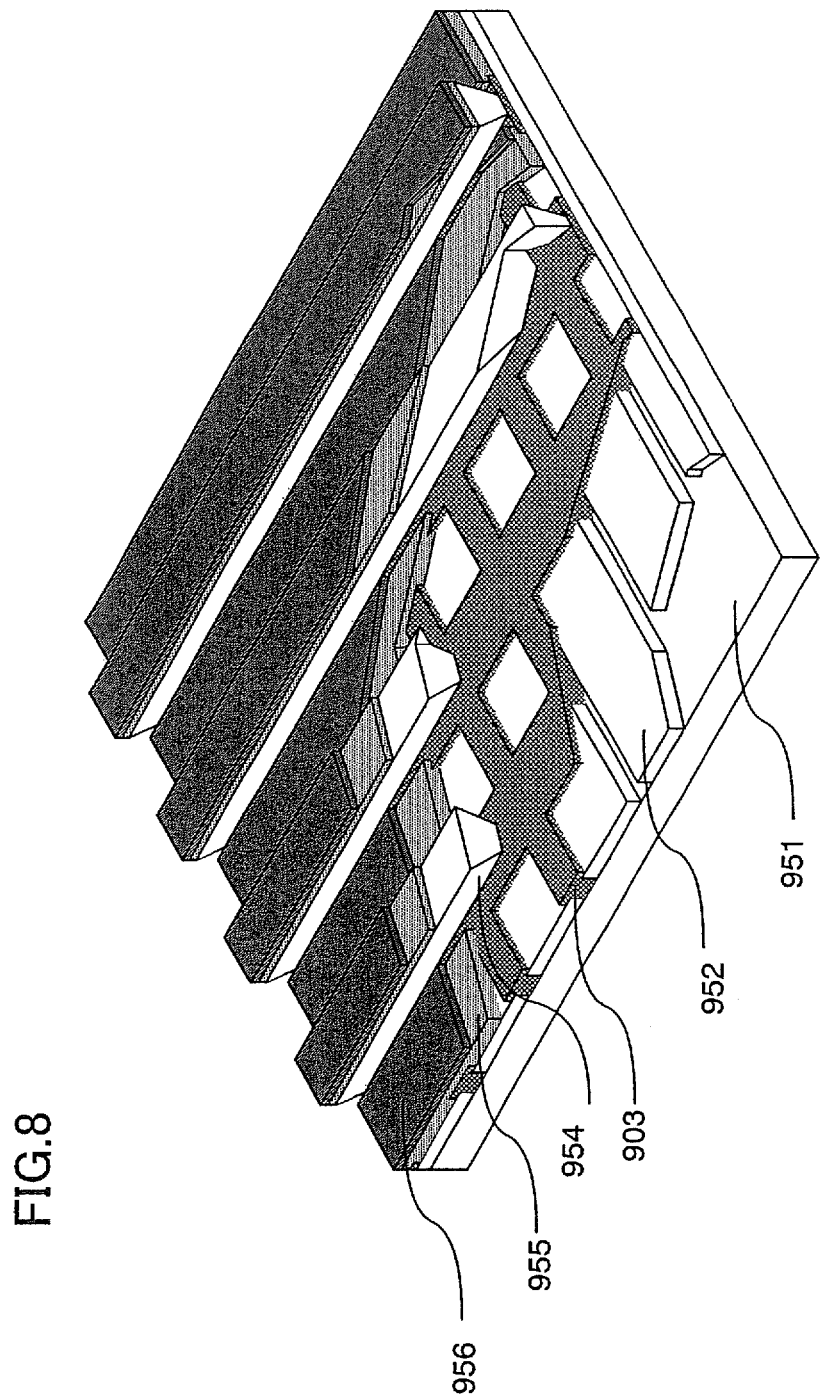
FIG. 8 describes a light emitting device.

As set forth above, in this embodiment mode, an active type light emitting device in which a transistor controls the driving of a light emitting element is described. In addition, however, the light emitting device may be a passive type light emitting device which drives the light emitting element without particularly providing an element for driving such as a transistor. FIG. 8 shows a perspective view of a passive type light emitting device that is manufactured in accordance with the present invention. In FIG. 8, a light emitting laminated body 955 is provided between an electrode 952 and an electrode 956, over a substrate 951. An end portion of the electrode 952 is covered with an insulating layer 903. A partition layer 954 is provided over the insulating layer 903. The side walls of the partition layer 954 are sloped so that the distance between one side wall and the other gradually narrows towards the surface of the substrate. In other words, a cross section of the narrow direction of the partition layer 954 has a trapezoidal shape, and a lower side (which faces a surface of the insulating layer 903 and is in contact with the insulating layer 903) is shorter than an upper side (which faces the surface of the insulating layer 903 and is not in contact with the insulating layer 903). In this manner, by providing a partition layer 954, a defect of the light emitting element due to static electricity and the like can be prevented. Further, by including the light emitting element of the present invention which operates with low driving voltage in a passive type light emitting device also, the passive type light emitting element can be driven with low power consumption. Short-circuiting of an element due to dust and the like can also be suppressed, and a light emitting device with fewer defects can be provided. Further, an efficient light emitting device can be formed. Furthermore, an efficient light emitting element can be formed even when carrying out a short circuit prevention measure or optical design.

Embodiment Mode 8

In this embodiment mode, electronic appliances of the present invention will be described.

As electronic appliances of the present invention, a camera such as a video camera and a digital camera, a goggle type display, a navigation system, a sound reproduction apparatus (such as a car audio or an audio component), a personal computer, a game machine, a mobile information terminal (such as a mobile computer, a cell phone, a portable game machine, or an electronic book), an image reproduction apparatus equipped with a recording medium (specifically, a device which can reproduce a recording medium such as a digital versatile disk (DVD) and is equipped with a display device capable of displaying the image) and the like can be given. Specific examples of these electronic appliances are shown in FIGS. 10A to 10E.

Figure 10A:
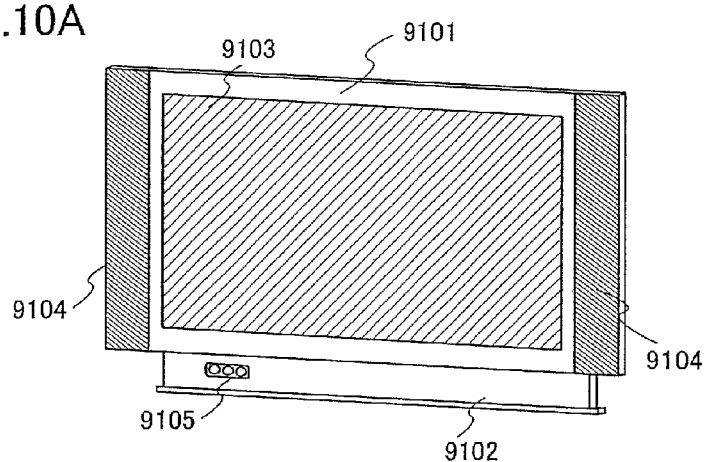
FIGS. 10A to 10E describe electronic appliances.

FIG. 10A is a television receiver including a housing 9101, a supporting base 9102, a display portion 9103, speaker portions 9104, a video input terminal 9105, and the like. The television receiver is manufactured by using a light emitting device having a light emitting element that is described in any one of Embodiment Modes 2 to 6, for the display portion 9103. As a result, a television receiver having a display portion with low power consumption and few defects can be obtained. Note that the television receiver includes all apparatuses for information display, such as for computers, for TV broadcastings, for advertisements, and the like.

Figure 10B:
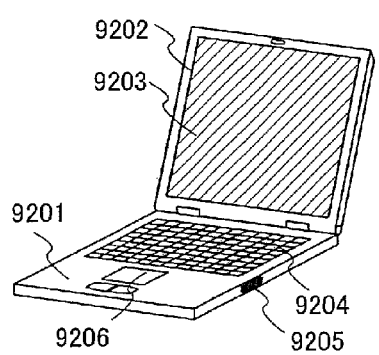

FIG. 10B is a computer including a main body 9201, a housing 9202, a display portion 9203, a keyboard 9204, an external connection port 9205, a pointing mouse 9206, and the like. The computer is manufactured by using the light emitting device having the light emitting element that is described in any one of Embodiment Modes 2 to 6, for the display portion 9203. As a result, a computer having a display portion with low power consumption and few defects can be obtained.

Figure 10C:
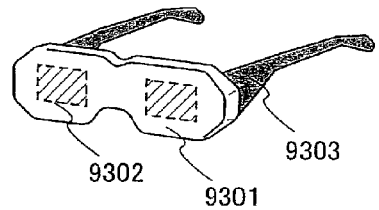

FIG. 10C is a goggle-type display including a main body 9301, a display portion 9302, arm portions 9303, and the like. The goggle-type display is manufactured by using the light emitting device having the light emitting element that is described in any one of Embodiment Modes 2 to 6, for the display portion 9302. As a result, a goggle type display having a display portion with low power consumption and few defects can be obtained.

Figure 10D:
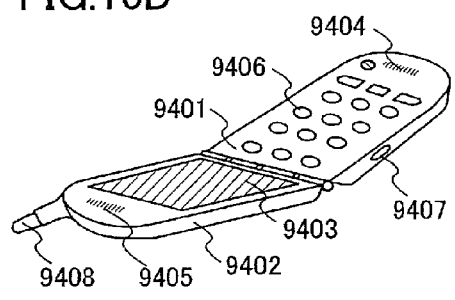

FIG. 10D is a cell phone including a main body 9401, a housing 9402, a display portion 9403, an audio input portion 9404, an audio output portion 9405, operation keys 9406, an external connection port 9407, an antenna 9408, and the like. The cell phone is manufactured by using the light emitting device having the light emitting element that is described in any one of Embodiment Modes 2 to 6, for the display portion 9403. As a result, a cell phone having a display portion with low power consumption and few defects can be obtained. Note that power consumption of the cell phone can be suppressed by displaying white characters against a black back for the display portion 9403.

Figure 10E:
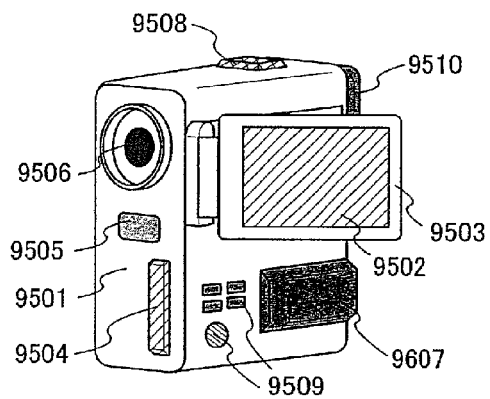

FIG. 10E is a camera including a main body 9501, a display portion 9502, a housing 9503, an external connection port 9504, a remote-control receiving portion 9505, an image receiving portion 9506, a battery 9507, an audio input portion 9508, operation keys 9509, an eyepiece portion 9510, and the like. The camera is manufactured by using the light emitting device having the light emitting element that is described in any one of Embodiment Modes 2 to 6, for the display portion 9502. As a result, a camera having a display portion with low power consumption and few defects can be obtained.

As set forth above, the application range of the present invention is extremely wide, and can be applied to electronic appliances in various fields. The electronic appliances of the present invention are electronic appliances of low power consumption, and have few defects.

Embodiment 1

Figure 12:
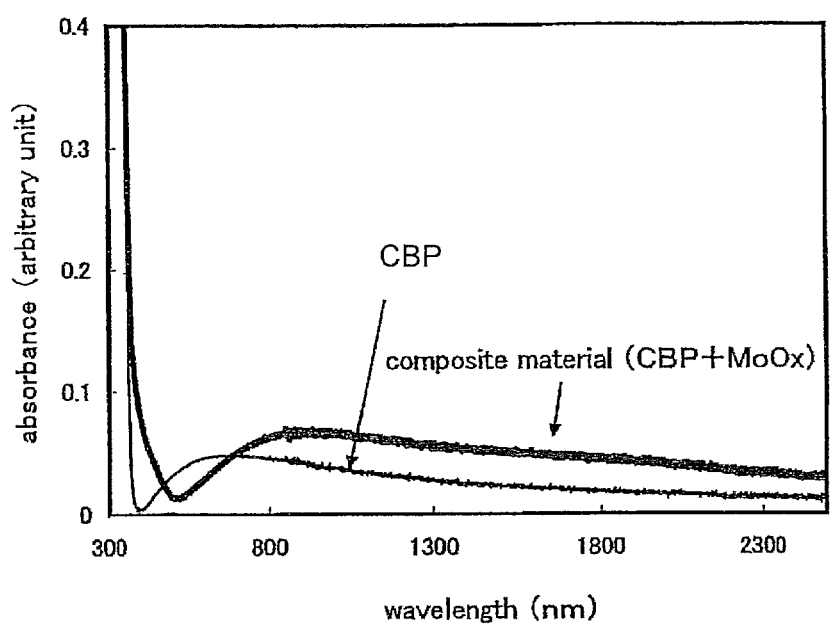
FIG. 12 shows absorption spectrums of CBP and a composite material of the present invention using CBP.

The absorption spectrum for the composite material of the present invention will be described in this embodiment. In FIG. 12, absorption spectrums of a film of the organic compound (4,4'-bis(N-carbazolyl)biphenyl (abbreviation: CBP)) alone represented in the above structural formula (8), and a film that is formed with the composite material of the present invention that is formed by CBP and molybdenum oxide (weight ratio of CBP to molybdenum oxide is 1:0.25, and molar ratio of CBP to molybdenum oxide is 1:0.8) is shown. Both the film formed of CBP alone and the film formed with the composite material of the present invention that is formed by CBP and molybdenum oxide, are formed by an evaporation method. In particular, the film formed with the composite material of the present invention that is formed with CBP and molybdenum oxide, was formed by a co-evaporation method. Note that for CBP, "DCBP (sublimed purified product)" manufactured by Dojindo Laboratories was used, and for the molybdenum oxide, 99.999% pure molybdic anhydride manufactured by Japan Pure Chemical Co., Ltd. was used.

From FIG. 12, it is observed that the absorption spectrum of the composite material of the present invention formed of CBP and molybdenum oxide, does not have large absorption in the visible light region, and it is a material having excellent transparency. Further, since the absorption spectrum of the composite material of the present invention formed of CBP and molybdenum oxide has a different form than the spectrum of CBP, the composite material of the present invention formed of CBP and molybdenum oxide being a different material from CBP is suggested.

Embodiment 2

In this embodiment, a characteristic of the light emitting element of the present invention using the composite material of the present invention will be described.

A manufacturing method for the light emitting element of the present invention used for measurement is described. First, as an electrode functioning as an anode of the light emitting element, ITSO was formed to have a thickness of 110 nm over a substrate by a sputtering method.

Subsequently, the composite material of the present invention was formed with a thickness of 50 nm over the ITSO by an evaporation method. The composite material in this embodiment includes CBP as an organic compound and molybdenum oxide as an inorganic material, and the mass ratio of CBP to molybdenum oxide was set to be 4:2. Note that for CBP, "DCBP (sublimed purified product)" manufactured by Dojindo Laboratories was used, and for the molybdenum oxide, 99.999% pure molybdic anhydride manufactured by Japan Pure Chemical Co., Ltd. was used. Also, as represented in the above general formula (3), CBP is one type of aryl carbazole having two carbazolyl groups.

Then, NPB was formed as a hole transporting layer with a thickness of 10 nm by an evaporation method, and a light emitting layer using $Alq_3$ as a host material and coumarin 6 as a guest material was formed over it so as to have a thickness of 40 nm. $Alq_3$ and coumarin 6 were formed by a co-evaporation method so as to have a weight ratio of 1:0.01.

Subsequently, as an electron transporting layer, $Alq_3$ was formed with a thickness of 10 nm by an evaporation method. As a hole injecting layer, $Alq_3$ and Li were formed to have a thickness of 30 nm by a co-evaporation method. $Alq_3$ and Li of the hole injecting layer were formed so as to have a weight ratio of 1:0.01.

Lastly, as an electrode functioning as a cathode of the light emitting element, Al was formed with a thickness of 200 nm, and the light emitting element of the present invention was formed.

As a comparative example, an element in a case where the organic compound for the layer of the light emitting element of the present invention which is formed of the composite material of the present invention, was CBP was measured; therefore a manufacturing method for the element will be described. First, as an electrode functioning as an anode of the light emitting element, a film of ITSO was formed to have a thickness of 110 nm thick over a substrate by a sputtering method.

Subsequently, CBP was formed with a thickness of 50 nm by an evaporation method over the ITSO. Note that for CBP, "DCBP (sublimed purified product)" manufactured by Dojindo Laboratories was used.

Then, NPB was formed as a hole transporting layer with a thickness of 10 nm by an evaporation method, and a light emitting layer using $Alq_3$ as a host material and coumarin 6 as a guest material was formed thereover so as to have a thickness of 40 nm. $Alq_3$ and coumarin 6 were formed by a co-evaporation method so as to have a weight ratio of 1:0.01.

Subsequently, as an electron transporting layer, $Alq_3$ was formed with a thickness of 10 nm by an evaporation method. As a hole injecting layer, $Alq_3$ and Li were formed to have a thickness of 30 nm by a co-evaporation method. The hole injecting layer was formed so that $Alq_3$ and Li have a weight ratio of 1:0.01.

Lastly, as an electrode functioning as a cathode of the light emitting element, Al was formed with a thickness of 200 nm, and the light emitting element of the comparative example was formed.

The structure of the light emitting element in this embodiment and the structure of the light emitting element of the comparative example are shown is the following table.

TABLE 1

| | substrate | ITSO | CBP:MoOx(4:2) CBP | NPB | Alq:coumarin 6 (1:0.01) | Alq | Al |
|---|---|---|---|---|---|---|---|
| embodiment comparative example | | | | | | | |

Figure 13:
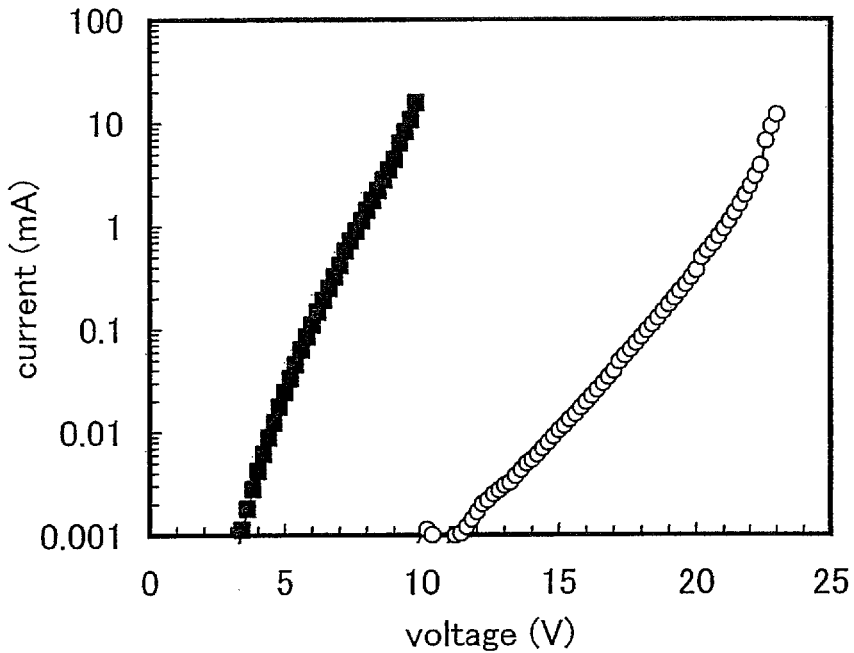
FIG. 13 is a voltage-current characteristic of a light emitting element of the present invention.
Figure 14:
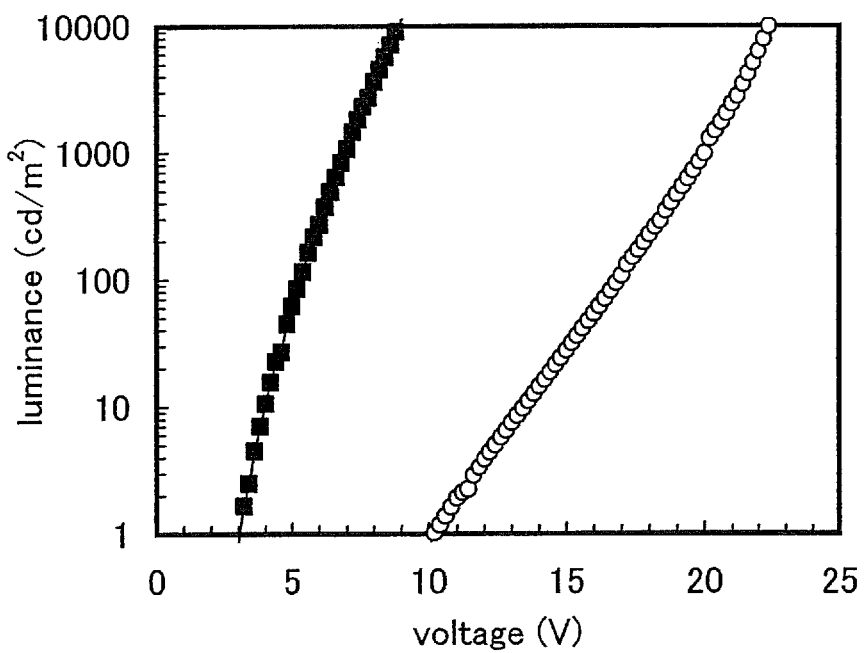
FIG. 14 is a voltage-luminance characteristic of a light emitting element of the present invention.

FIG. 14 and FIG. 13 show luminance-voltage characteristics and current-voltage characteristics of the light emitting element of the present invention and the light emitting element of the comparative example, which were manufactured in the above manner.

FIG. 13 shows that the light emitting element of the present invention using CBP as the organic compound can allow more current to flow with lower voltage than the light emitting element using only CBP instead. Also, FIG. 14 shows that the light emitting element of the present invention using CBP as the organic compound can obtain greater luminance of emitted light with lower voltage than the light emitting element using only CBP instead. As a result, it can be understood that by using the composite material of the present invention, less voltage can be applied to a light emitting element. Also, it is found that the light emitting element of the present invention is an element with less voltage applied.

Embodiment 3

In this embodiment, a light emitting element as described in Embodiment Mode 5 (FIG. 5) that is provided with a layer using the composite material of the present invention on both sides of a layer taking on a light emitting function, will be described. The reference numerals in FIG. 5 are used below As a first electrode 201 that functions as an anode of the light emitting element, a film of ITSO was formed to have a thickness of 110 nm over a substrate by a sputtering method.

Subsequently, as a first layer 2111, the composite material of the present invention was formed with a thickness of 50 nm over the ITSO by an evaporation method. The composite material includes CBP as an organic compound and molybdenum oxide as an inorganic compound in the same manner as in Embodiment 2, and was formed by co-evaporating CBP and molybdic anhydride so that the mass ratio of CBP:molybdenum oxide was 4:2.

Next, a layer 212 that takes on a light emitting function, in which a hole transporting layer, a light emitting layer, and an electron transporting layer are sequentially stacked, was formed. Note that the hole transporting layer was formed by depositing 10 nm of NPB. Also, the light emitting layer was formed by co-evaporating $Alq_3$ and coumarin 6 at a mass ratio of 1:0.01 (in other words, $Alq_3$ is a host material, and coumarin 6 is a guest material). The film thickness was 40 nm. The electron transporting layer was formed by depositing $Alq_3$ with a thickness of 10 nm.

Further, as a third layer 213, a layer that is formed with $Alq_3$ and Li was formed with a thickness of 10 nm by co-evaporating $Alq_3$ and Li. At this time, the ratio of $Alq_3$ and Li was adjusted so that $Alq_3$:Li=1:0.01 in mass ratio. Note that $Alq_3$ functions as an electron transporting substance, and Li functions as a substance exhibiting an electron donating property with respect to the electron transporting substance.

Subsequently, as a fourth layer 214, a film of the composite material of the present invention was formed with a thickness of 20 nm by an evaporation method. The composite material includes CBP as an organic compound and molybdenum oxide as an inorganic compound in the same manner as for the first layer 211, and was formed by co-evaporating CBP and molybdic anhydride so that the mass ratio of CBP:molybdenum oxide was 4:2.

Lastly, as a second electrode 202 that functions as a cathode, Al was formed with a thickness of 200 nm, and the light emitting element of this embodiment was obtained.

Figure 16:
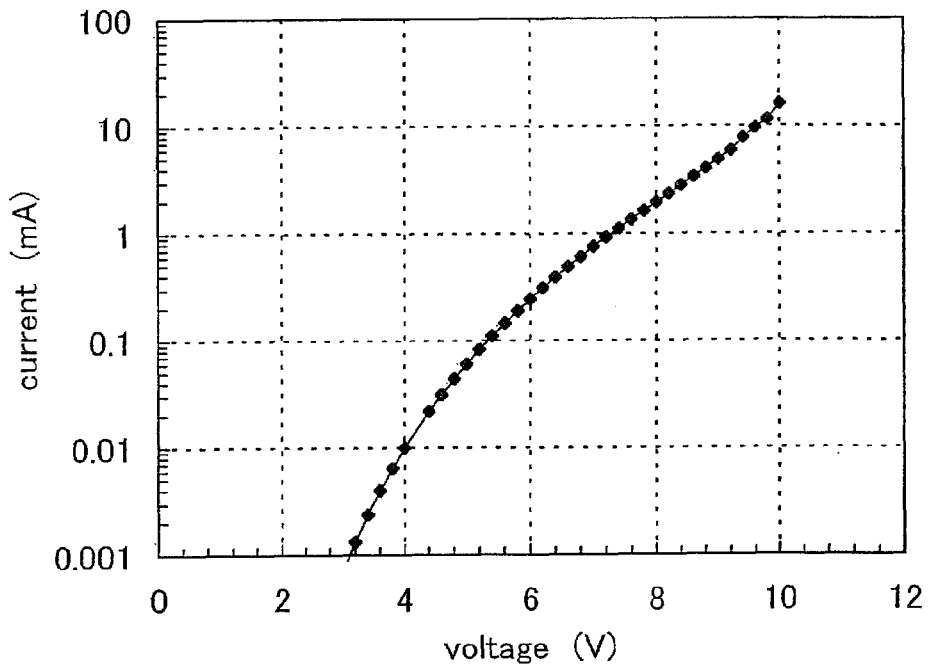
FIG. 16 is a voltage-current characteristic of a light emitting element of the present invention.
Figure 17:
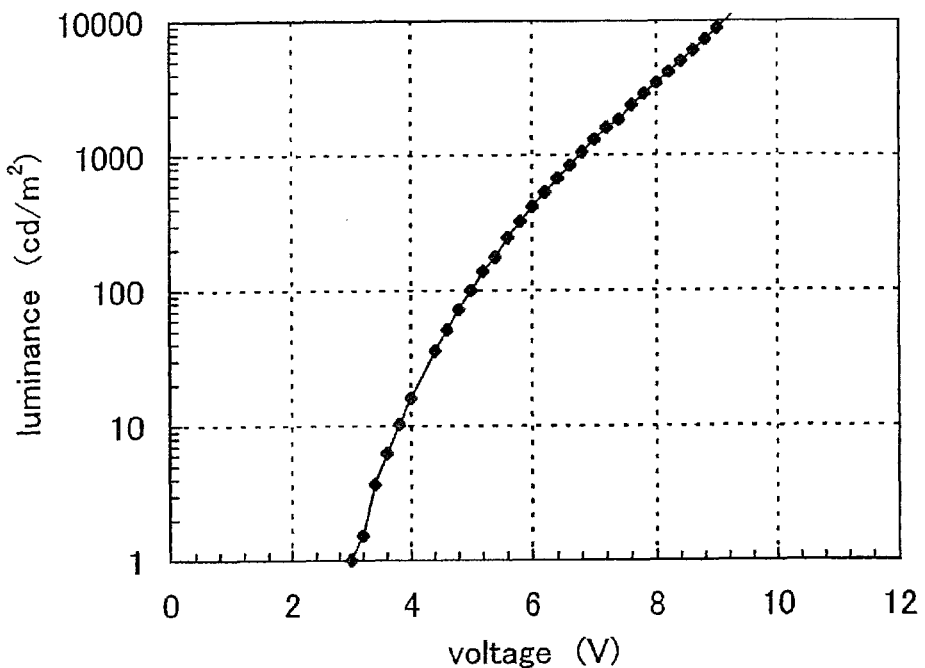
FIG. 17 is a voltage-luminance characteristic of a light emitting element of the present invention.

FIG. 16 and FIG. 17 show each of a current-voltage characteristic and a luminance-voltage characteristic of the light emitting element of the present invention that was formed in the above manner. From this, it was found that a light emitting element such as the one in FIG. 5, in which a layer using the composite material of the present invention is provided on both sides of a layer taking on a light emitting function, also operates with low driving voltage.

Embodiment 4

In this embodiment, a light emitting element was manufactured in the same manner as in Embodiment 2, except that CzPA represented in the structural formula (24) was used instead of CBP. Note that CzPA is one type of aryl carbazole having one carbazolyl group, as represented in the above general formula (2).

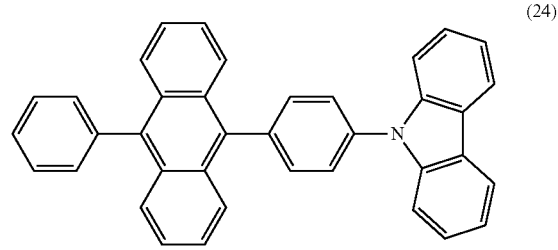

(24)

Figure 18:
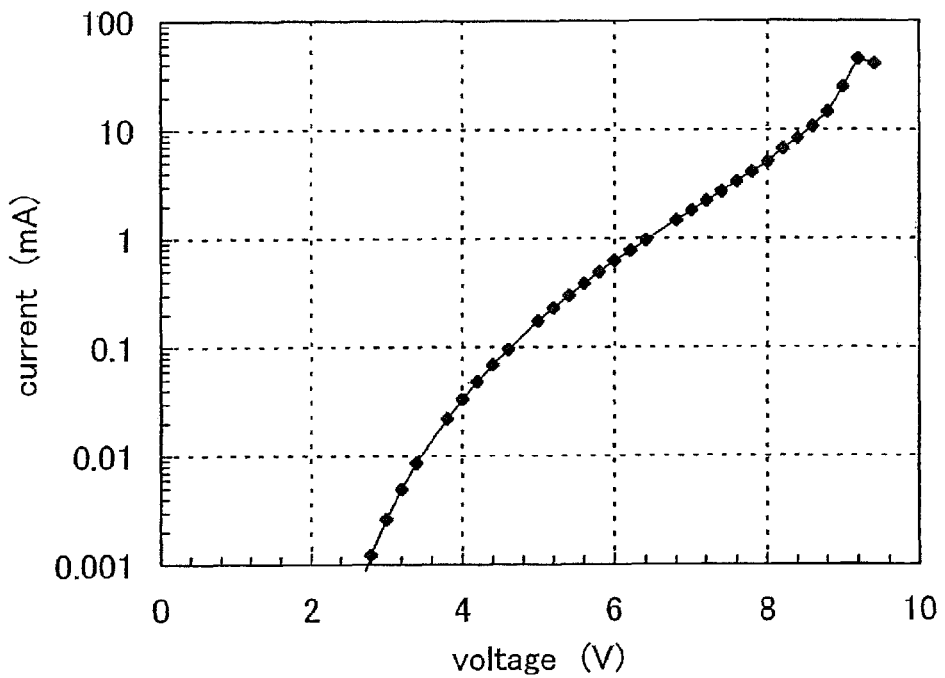
FIG. 18 is a voltage-current characteristic of a light emitting element of the present invention.
Figure 19:
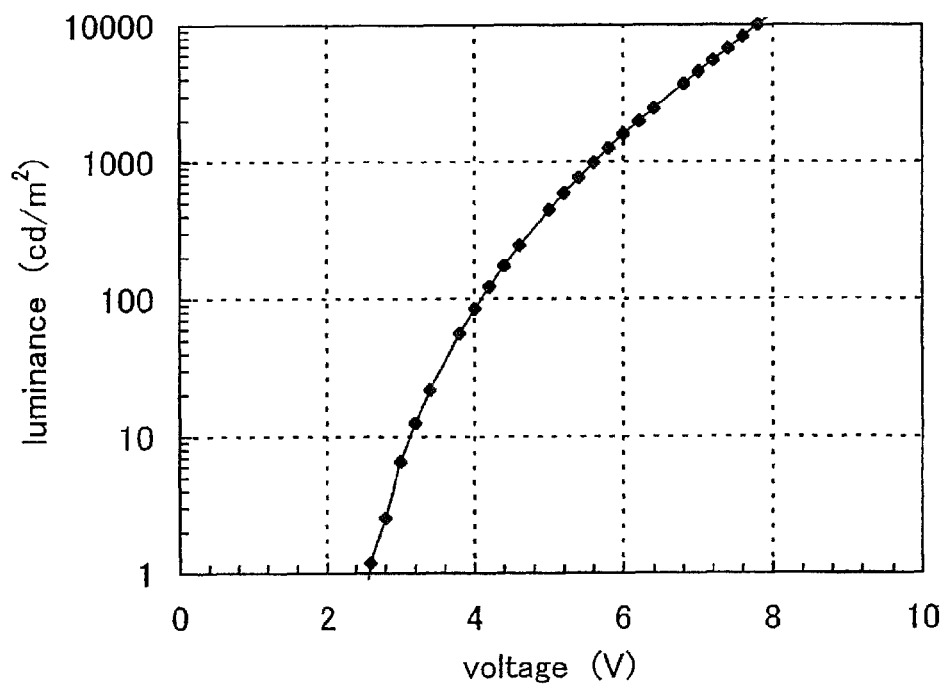
FIG. 19 is a voltage-luminance characteristic of a light emitting element of the present invention.

FIG. 18 and FIG. 19 show the current-voltage characteristic and the luminance-voltage characteristic, respectively, of the manufactured light emitting element of the present invention. From this, it was found that the light emitting element using the composite material of the present invention operates with low driving voltage.

Embodiment 5

In this embodiment, a light emitting element was manufactured in the same manner as in Embodiment 3, except that CzPA was used instead of CBP.

Figure 20:
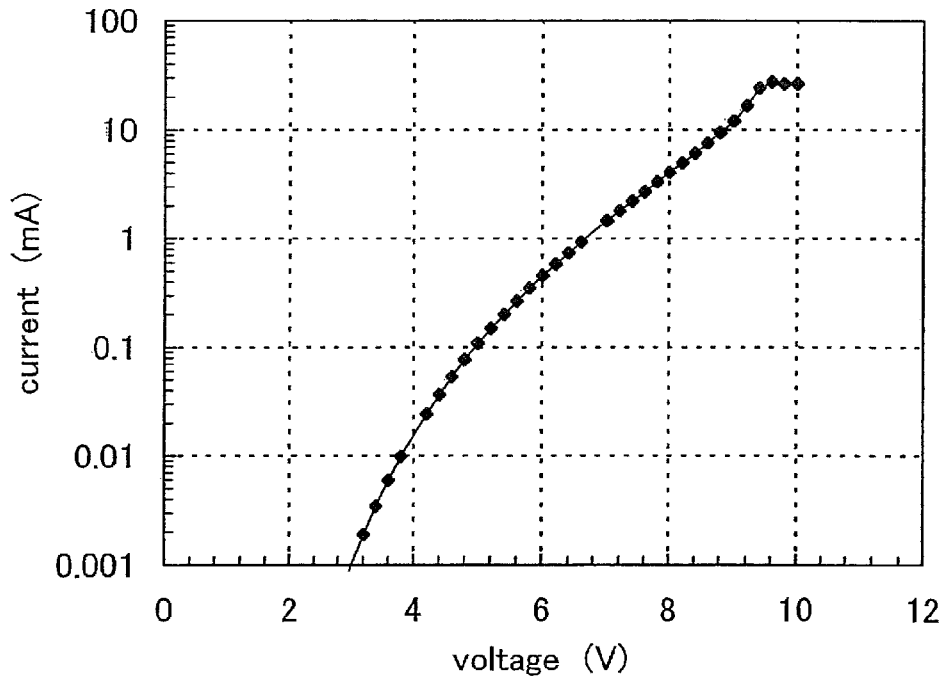
FIG. 20 is a voltage-current characteristic of a light emitting element of the present invention.
Figure 21:
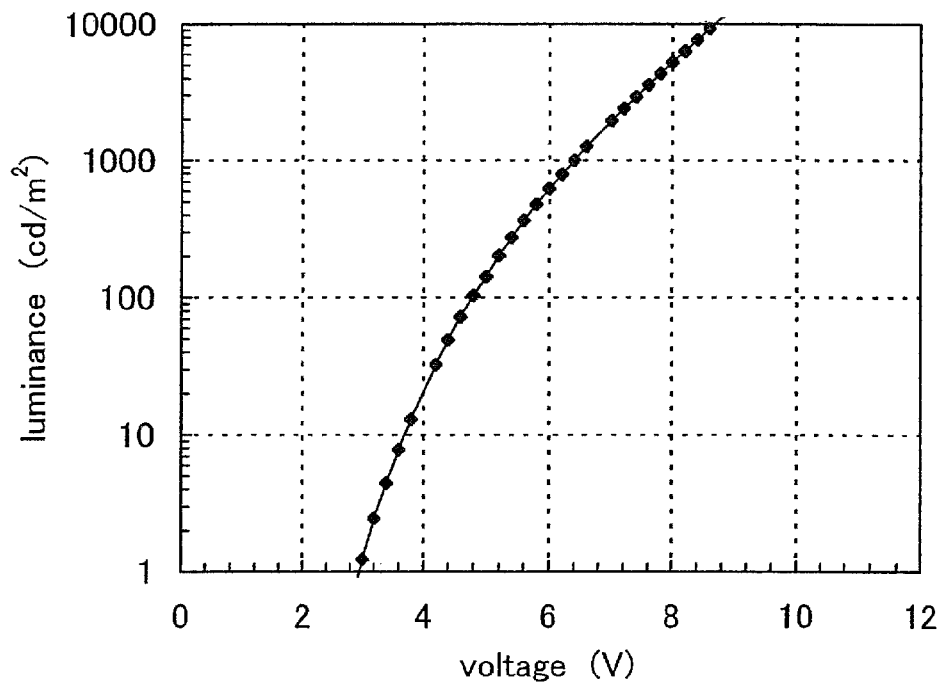
FIG. 21 is a voltage-luminance characteristic of a light emitting element of the present invention.

FIG. 20 and FIG. 21 show the current-voltage characteristic and the luminance-voltage characteristic, respectively, of the manufactured light emitting element of the present invention. From this, it was found that a light emitting element such as the one in FIG. 5, in which a layer using the composite material of the present invention is provided on both sides of a layer taking on a light emitting function, also operates with low driving voltage.

Embodiment 6

In this embodiment, a characteristic of the light emitting element of the present invention using the composite material of the present invention is described. In this embodiment, as an organic compound for the composite material of the present invention, TCzB represented in the structural formula

(25) below, was used. Note that as represented in the above general formula (4), TCzB is one type of aryl carbazole having three carbazolyl groups.

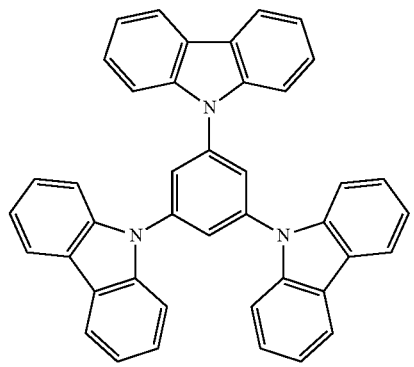

(25)

First, as an electrode that functions as an anode of the light emitting element, a 110 nm film of ITSO was formed by a sputtering method.

Subsequently, the composite material of the present invention was formed with a thickness of 50 nm by an evaporation method, over the ITSO. The composite material includes TCzB as an organic compound and molybdenum oxide as an inorganic compound, and was formed by co-evaporating TCzB and molybdic anhydride so that the mass ratio of CBP: molybdenum oxide was 4:2.

Next, as a hole transporting layer, TCzB was deposited to be 10 nm thick. As a light emitting layer which emits blue light, t-BuDNA was deposited thereover with a thickness of 40 nm. Further, $Alq_3$ was deposited to be 20 nm thick as an electron transporting layer. Lastly, as an electrode that functions as a cathode, Al was deposited to be 200 nm thick, and the light emitting element of the present invention was obtained.

Figure 22:
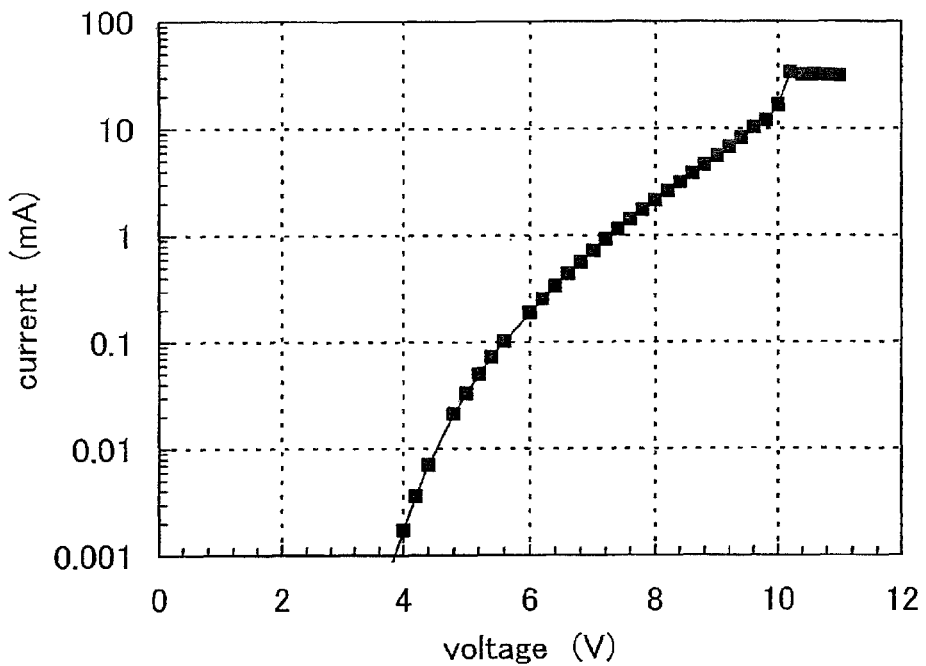
FIG. 22 is a voltage-current characteristic of a light emitting element of the present invention.
Figure 23:
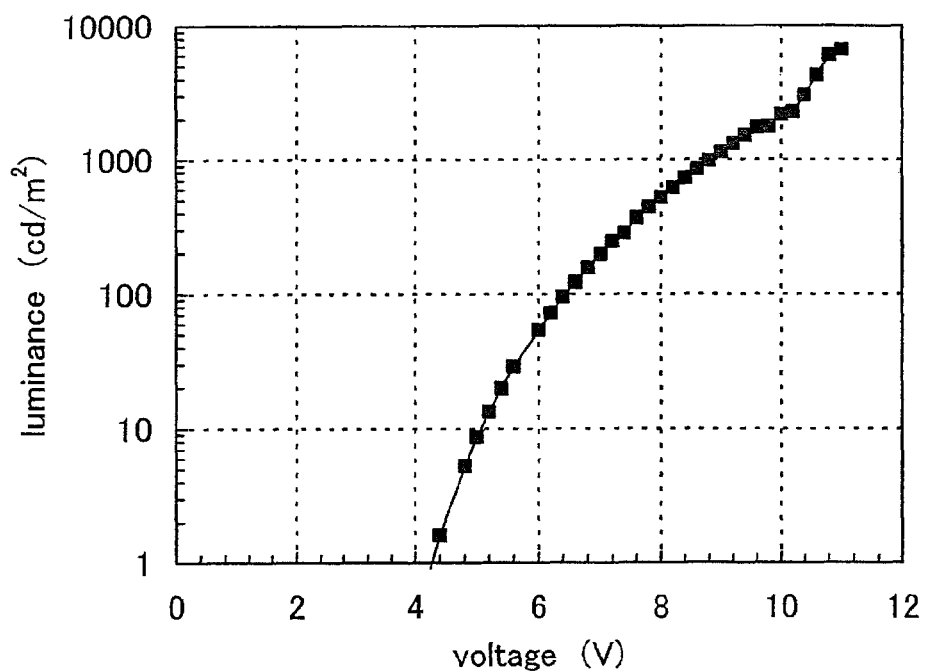
FIG. 23 is a voltage-luminance characteristic of a light emitting element of the present invention.

FIG. 22 and FIG. 23 show the current-voltage characteristic and the luminance-voltage characteristic, respectively, of the light emitting element of the present invention formed in the above manner. From this, it was found that the light emitting element using the composite material of the present invention operates with low driving voltage.

Embodiment 7

Figure 15A:
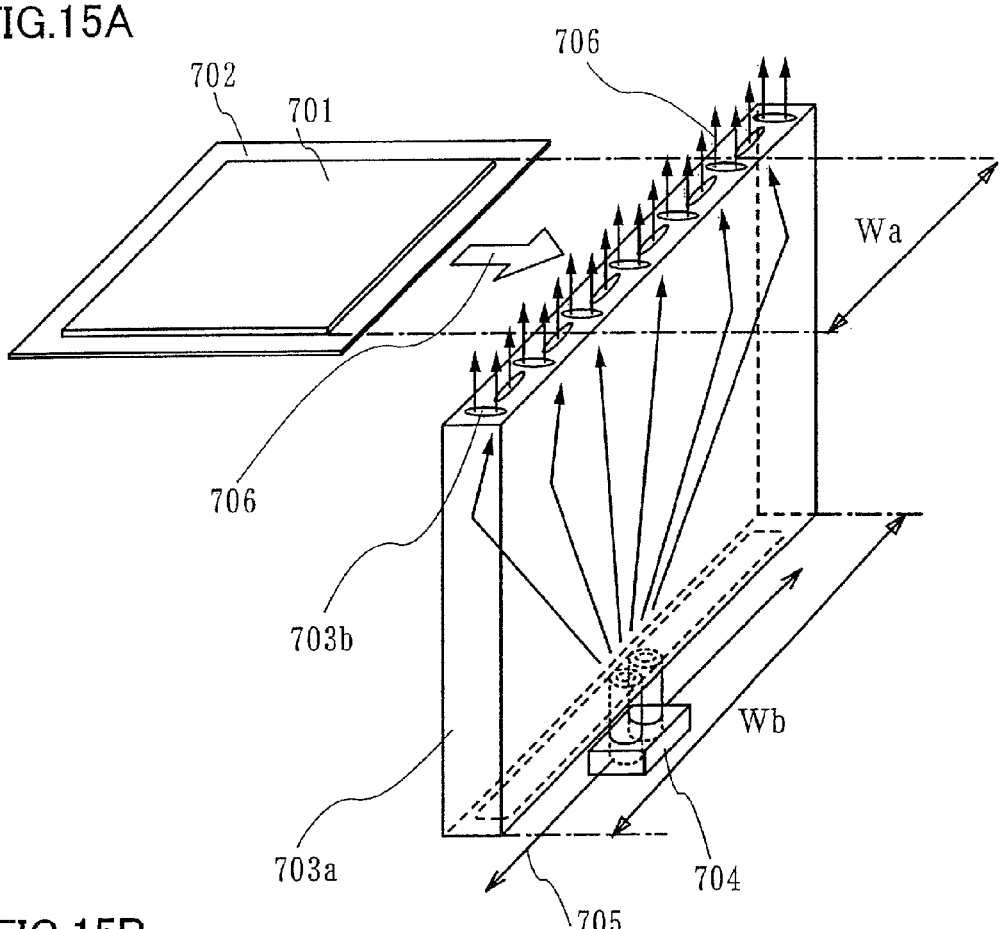
FIGS. 15A and 15B describe a vapor deposition apparatus.

In this embodiment, a vapor deposition apparatus for forming a layer that is formed with the composite material of the present invention will be described. As an example of the vapor deposition apparatus, a perspective view is shown in FIG. 15A. A mechanism of the vapor deposition apparatus is briefly described below.

A substrate 701 is preliminarily aligned with a vapor deposition mask 702, and the substrate is transported in a direction of an arrow 706 while in the aligned state with the vapor deposition mask 702. The substrate is transported and passes above a deposition shield 703a. The deposition shield 703a has openings 703b, and a deposition material from a deposition source 704 is sublimed through the openings 703b. In order to maintain a sublimation direction 716 of the deposition material from the openings 703b, the deposition shield 703a is heated so that the deposition material does not stick to the deposition shield itself.

A plurality of crucibles can be set on the deposition source 704, and the deposition source 704 can also be moved in a direction of an arrow 705. A resistance heating method is used for an evaporation method. Further, it is desirable that a movement range of the deposition source is wider than a width Wa of the substrate. Furthermore, by a width Wb of the deposition shield also being wider than the width Wa of the substrate, the uniformity of a deposited film is improved.

In other words, the vapor deposition apparatus that is shown in FIG. 15A has a mechanism of providing the deposition shield to maintain the sublimation direction of the deposition material in a film-forming chamber, providing a plurality of openings, wherein the deposition material is sublimed through those openings. A lower portion of the deposition shield has the deposition source that can move in a perpendicular direction to a movement direction (also called a transport direction) of the substrate. Further, the film thickness uniformity of a deposited film is improved by the width Wb of the deposition shield being wider than the width Wa of the substrate.

Note that, there are no particular limits to the shape or number of the openings 703b for the vapor deposition apparatus in FIG. 15A.

Figure 15B:
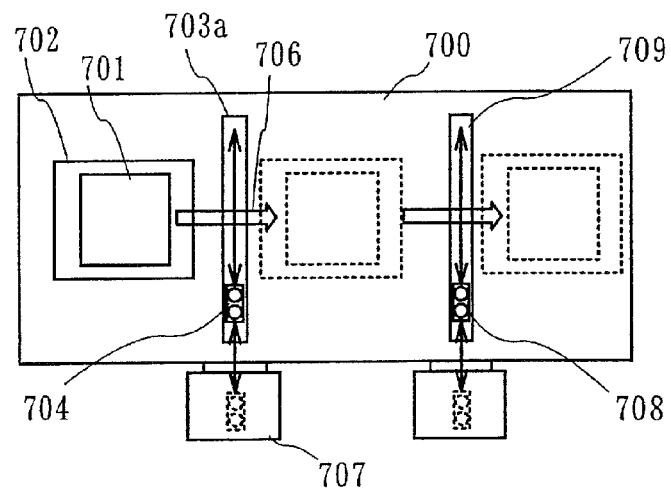

In order to replenish the crucibles of the deposition source with the deposition material, a setting chamber that is attached to the film-forming chamber via a gate may be provided. Also, a plurality of deposition sources and deposition shields may be provided in a single film-forming chamber. A top view of a vapor deposition apparatus in a case of providing a plurality of deposition sources and setting chambers is shown in FIG. 15B. A setting chamber 707 is provided in the movement direction (direction of the arrow 705) of the deposition source, and when replenishing the deposition material, replenishment can be carried out by moving the deposition source to the setting chamber. In order to replenish the evaporation source with the deposition material in a case where the deposition source is fixed to the film-forming chamber, the inside of the film-forming chamber must be at atmospheric pressure, and in order to carry out another deposition, it takes time to make the inside of the film-forming chamber into a vacuum again. By providing the setting chamber 707, the deposition material can be replenished in a short amount of time since only the inside of the setting chamber needs to change between atmospheric pressure and a vacuum, while the degree of vacuum of the film-forming chamber 700 is maintained.

Also, another deposition shield 709 may be provided to be parallel to the deposition shield 703a, and another deposition source 708 that moves perpendicularly to the movement direction of the substrate may be provided. By providing a plurality of deposition sources in a single film-forming chamber, it is possible to form stacked layers continuously. Although an example of providing two deposition sources in a single film-forming chamber is described herein, more deposition sources may be provided in a single film-forming chamber.

In other words, for a single film-forming chamber, films of the same deposition material may be formed continuously by providing two deposition shields in the direction perpendicular to the transport direction of the substrate, and providing a deposition source for each of them. By such a vapor deposition apparatus, the speed of film formation can go up. Note that the two deposition shields are provided to be parallel to each other, and have enough space in between.

Furthermore, different deposition materials may be set in the two deposition sources and stacked layers may be formed continuously. For example, by setting an organic compound and an inorganic compound separately in the two crucibles of the deposition source 704, and allowing a substrate to pass above the deposition source 704, a layer that is formed of the composite material of the present invention is deposited on the substrate. Subsequently, by moving the substrate and setting the organic compound that is a material for a layer that takes on a light emitting function in the crucibles of the other deposition source 708, and allowing the substrate to pass above the deposition source 708, a light emitting layer can be deposited over the layer that is formed of the composite material of the present invention.

This application is based on Japanese Patent Application serial no. 2005-085056 filed in Japan Patent Office on Mar. 23, 2005, the contents of which are hereby incorporated by reference.

EXPLANATION OF REFERENCE

100: substrate, 101: first electrode, 102: second electrode; 103: light emitting laminated body, 111: first layer, 112: second layer, 200: substrate 201: first electrode, 202: second electrode, 203: light emitting laminated body, 211: first layer, 212: second layer, 213: third layer, 214: fourth layer, 301: first electrode, 302: second electrode, 303: light emitting laminated body, 311: first layer, 312: second layer, 313: third layer, 401: first electrode, 402: second electrode, 403: light emitting laminated body, 411: first layer, 412: second layer, 413: third layer, 414: fourth layer, 601: source side driving circuit, 602: pixel portion, 603: gate side driving circuit, 604: sealing substrate, 605: sealant, 607: space, 608: wiring, 609: FPC (flexible print circuit), 610: element substrate, 611: switching TFT, 612: current control TFT, 613: first electrode, 614: insulator, 616: light emitting laminated body, 617: second electrode, 618: light emitting element, 623: n-channel type TFT; 624: p-channel type TFT, 700: film-forming chamber, 701: substrate, 702: vapor deposition mask, 703*a*: deposition shield, 703*b*: opening, 704: deposition source, 705: arrow, 706: arrow, 707: setting chamber, 708: deposition source, 709: deposition shield, 716: sublimation direction, 951: substrate, 952: electrode, 903: insulating layer, 954: partition layer, 955: light emitting laminated layer, 956: electrode, 9101: housing, 9102: supporting base, 9103: display portion, 9104: speaker portion, 9105: video input terminal, 9201: main body, 9202: housing, 9203: display portion, 9204: keyboard, 9205: external connection port, 9206: pointing mouse, 9301: main body, 9302: display portion, 9303: arm portion, 9401: main body, 9402: housing, 9403: display portion, 9404: audio input portion, 9405: audio output portion, 9406: operation key, 9407: external connection port, 9408: antenna, 9501: main body, 9502: display portion, 9503: housing, 9504: external connection port, 9505: remote-control receiving portion, 9506: image receiving portion, 9507: battery, 9508: audio input portion, 9509: operation key, 9510: eye piece portion.

What is claimed is:

1. A light emitting device comprising a light emitting element, the light emitting element comprising:
    an anode;
    a layer over and in contact with the anode, the layer comprising an aryl carbazole compound which does not have an arylamine skeleton and an inorganic compound selected from tantalum oxide, molybdenum oxide, tungsten oxide, and ruthenium oxide;
    a hole transporting layer over the layer, the hole transporting layer comprising an aromatic amine compound;
    a light emitting layer over the hole transporting layer, the light emitting layer comprising a light emitting substance; and
    a cathode over the light emitting layer.

2. The light emitting device according to claim 1, wherein a thickness of the layer is 60 nm or more.

3. An electronic appliance comprising the light emitting device according to claim 1.

4. A lighting device comprising the light emitting device according to claim 1.

5. A light emitting device comprising a light emitting element, the light emitting element comprising:
    an anode;
    a light emitting layer over the anode, the light emitting layer comprising a light emitting substance;
    a first layer over the light emitting layer, the first layer comprising an electron transporting substance;
    a second layer over the first layer, the second layer comprising an aryl carbazole compound which does not have an arylamine skeleton and an inorganic compound selected from tantalum oxide, molybdenum oxide, tungsten oxide, and ruthenium oxide; and
    a cathode over the second layer.

6. The light emitting device according to claim 5, wherein a thickness of the second layer is 60 nm or more.

7. The light emitting device according to claim 5, wherein the first layer further comprises a substance exhibiting an electron donating property with respect to the electron transporting substance.

8. An electronic appliance comprising the light emitting device according to claim 5.

9. A lighting device comprising the light emitting device according to claim 5.

10. A light emitting device comprising a light emitting element, the light emitting element comprising:
    an anode;
    a first layer over the anode, the first layer comprising a first aryl carbazole compound and a first inorganic compound;
    a light emitting layer over the first layer, the light emitting layer comprising a light emitting substance;
    a second layer over the light emitting layer, the second layer comprising an electron transporting substance;
    a third layer over the second layer, the third layer comprising a second aryl carbazole compound and a second inorganic compound; and
    a cathode over the light emitting layer,
    wherein each of the first aryl carbazole compound and the second aryl carbazole compound does not have an arylamine skeleton, and
    wherein each of the first inorganic compound and the second inorganic compound is selected from tantalum oxide, molybdenum oxide, tungsten oxide, and ruthenium oxide.

11. The light emitting device according to claim 10, wherein a thickness of at least one of the first layer and the third layer is 60 nm or more.

12. The light emitting device according to claim 10, wherein the second layer further comprises a substance exhibiting an electron donating property with respect to the electron transporting substance.

13. An electronic appliance comprising the light emitting device according to claim 10.

14. A lighting device comprising the light emitting device according to claim 10.

15. A light emitting device comprising a light emitting element, the light emitting element comprising:
    an anode;
    a first light emitting layer over the anode, the first light emitting layer comprising a first light emitting substance;

a second layer over the first light emitting layer comprising, the second layer comprising an electron transporting substance;

a third layer over the second layer, the third layer comprising an aryl carbazole compound which does not have an arylamine skeleton and an inorganic compound selected from tantalum oxide, molybdenum oxide, tungsten oxide, and ruthenium oxide;

a second light emitting layer over the third layer, the second light emitting layer comprising a second light emitting substance; and a cathode over the second light emitting layer.

16. The light emitting device according to claim 15, wherein a thickness of the third layer is 60 nm or more.

17. The light emitting device according to claim 15, wherein the second layer further comprises a substance exhibiting an electron donating property with respect to the electron transporting substance.

18. An electronic appliance comprising the light emitting device according to claim 15.

19. A lighting device comprising the light emitting device according to claim 15.

* * * * *